US012648377B2

(12) United States Patent
Taira et al.

(10) Patent No.: US 12,648,377 B2
(45) Date of Patent: Jun. 2, 2026

(54) METHOD OF FORMING FILM, METHOD OF MANUFACTURING SEMICONDUCTOR DEVICE, FILM FORMING APPARATUS, AND RECORDING MEDIUM

(71) Applicant: KOKUSAI ELECTRIC CORPORATION, Tokyo (JP)

(72) Inventors: Yuki Taira, Toyama (JP); Masaru Kadoshima, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/813,448

(22) Filed: Aug. 23, 2024

(65) Prior Publication Data

US 2024/0412969 A1    Dec. 12, 2024

Related U.S. Application Data

(63) Continuation of application No. PCT/JP2022/007515, filed on Feb. 24, 2022.

(51) Int. Cl.
  *H10P 14/694*      (2026.01)
  *C23C 16/52*      (2006.01)
  *H10P 14/60*      (2026.01)

(52) U.S. Cl.
  CPC ........ *H10P 14/69433* (2026.01); *C23C 16/52* (2013.01); *H10P 14/6336* (2026.01); *H10P 14/6339* (2026.01)

(58) Field of Classification Search
  CPC ........... H01L 21/0217; H01L 21/02274; H01L 21/0228; H01L 21/02211; H01L 21/31;
  (Continued)

(56) References Cited

U.S. PATENT DOCUMENTS

2006/0105106 A1    5/2006 Balseanu et al.
2008/0132083 A1    6/2008 Matsuura
    (Continued)

FOREIGN PATENT DOCUMENTS

JP    2003188159 A  *  7/2003
JP    2004063304 A  *  2/2004  ......... H10K 59/8731
    (Continued)

OTHER PUBLICATIONS

Machine translation, JP 2003188159 (Year: 2003).*
    (Continued)

*Primary Examiner* — Michael G Miller
(74) *Attorney, Agent, or Firm* — Volpe Koenig

(57)        ABSTRACT
There is provided technique that includes: (a) forming a first nitridation film on a substrate housed in a process container by supplying a first film-forming agent to the substrate; and (b) forming a second nitridation film on a surface of the first nitridation film adhering to an inside of the process container by supplying a second film-forming agent to the first nitridation film adhering to the inside of the process container in (a). When the first nitridation film having a tensile stress is formed in (a), the second nitridation film having a compressive stress is formed in (b), and when the first nitridation film having a compressive stress is formed in (a), the second nitridation film having a tensile stress is formed in (b).

20 Claims, 7 Drawing Sheets

(58) Field of Classification Search
CPC ........... H01L 21/02247; H01L 21/0254; H01L 21/67098; H01L 21/68785; H01J 37/32174; H01J 37/32532; C23C 16/52; C23C 16/345
See application file for complete search history.

(56) References Cited

U.S. PATENT DOCUMENTS

| | | | |
|---|---|---|---|
| 2008/0139003 A1 * | 6/2008 | Pirzada | H05H 1/46 |
| | | | 438/785 |
| 2013/0171838 A1 | 7/2013 | Okuda | |
| 2017/0271144 A1 | 9/2017 | Hashimoto et al. | |
| 2022/0208544 A1 | 6/2022 | Koshi et al. | |

FOREIGN PATENT DOCUMENTS

| | | | | |
|---|---|---|---|---|
| JP | 2007005627 A | * | 1/2007 | |
| JP | 2008-140864 A | | 6/2008 | |
| JP | 2008-522405 A | | 6/2008 | |
| JP | 2011-231345 A | | 11/2011 | |
| JP | 2013-093551 A | | 5/2013 | |
| JP | 2017-168786 A | | 9/2017 | |
| JP | 2022011367 A | * | 1/2022 | ....... H01L 21/67017 |
| WO | 2021/053987 A1 | | 3/2021 | |

OTHER PUBLICATIONS

Machine translation, JP 2004063304 (Year: 2004).*
Machine translation, JP 2007005627 (Year: 2007).*
Machine translation, JP 2022011367 (Year: 2022).*

* cited by examiner

FIG. 1

FIRST NITRIDATION FILM

METHOD OF FORMING FILM, METHOD OF MANUFACTURING SEMICONDUCTOR DEVICE, FILM FORMING APPARATUS, AND RECORDING MEDIUM

CROSS-REFERENCE TO RELATED APPLICATION

This application is a Bypass Continuation Application of PCT International Application No. PCT/JP2022/007515, filed on Feb. 24, 2022, the entire contents of which are incorporated herein by reference.

BACKGROUND OF THE INVENTION

Field

The present disclosure relates to a method of forming a film, a method of manufacturing a semiconductor device, a film forming apparatus, and a recording medium.

Description of the Related Art

As one step of the semiconductor device manufacturing process, a step of forming a nitridation film on the surface of a substrate housed in a process container may be performed.

SUMMARY OF THE INVENTION

However, when forming the nitridation film on the substrate, the nitridation film may also be formed in the process container and adhere to the inside of the process container, and film peeling may occur due to stress of the nitridation film adhering to the inside of the process container.

Some embodiments of the present disclosure provide a technique capable of suppressing the occurrence of film peeling by reducing the stress of a film adhering to the inside of a process container.

According to one aspect of the present disclosure, there is provided a technique including:

(a) forming a first nitridation film on a substrate housed in a process container by supplying a first film-forming agent to the substrate; and (b) forming a second nitridation film on a surface of the first nitridation film adhering to an inside of the process container by supplying a second film-forming agent to the first nitridation film adhering to the inside of the process container in (a).

When the first nitridation film having a tensile stress is formed in (a), the second nitridation film having a compressive stress is formed in (b).

When the first nitridation film having a compressive stress is formed in (a), the second nitridation film having a tensile stress is formed in (b).

BRIEF DESCRIPTION OF THE DRAWINGS

FIG. 1 is a schematic configuration diagram of a vertical process furnace of a film forming apparatus appropriately used in one aspect of the present disclosure, and is a diagram illustrating a vertical cross-sectional view of a process furnace 202 portion.

DETAILED DESCRIPTION

First Aspect of Present Disclosure

Figure 1:
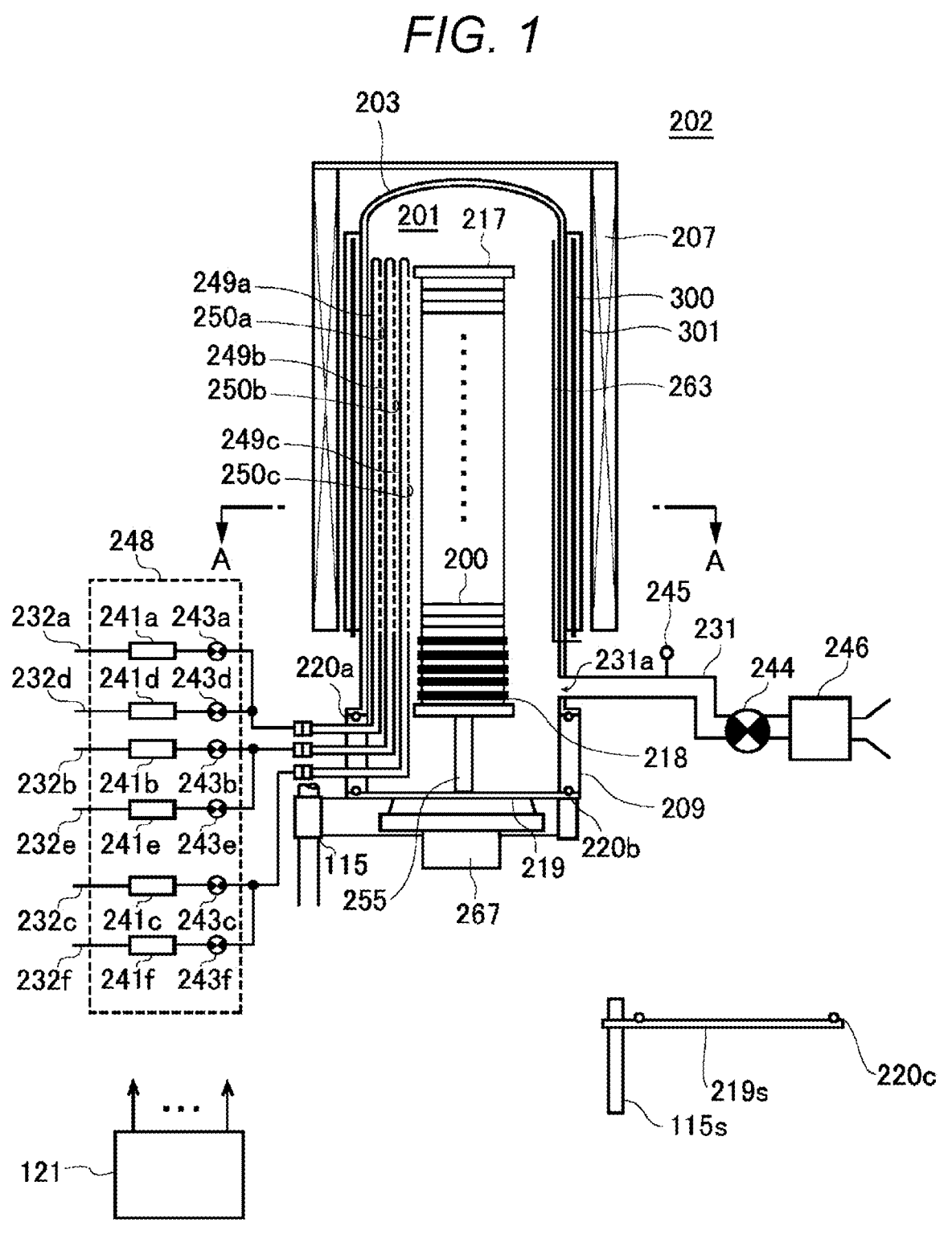
Figure 2:
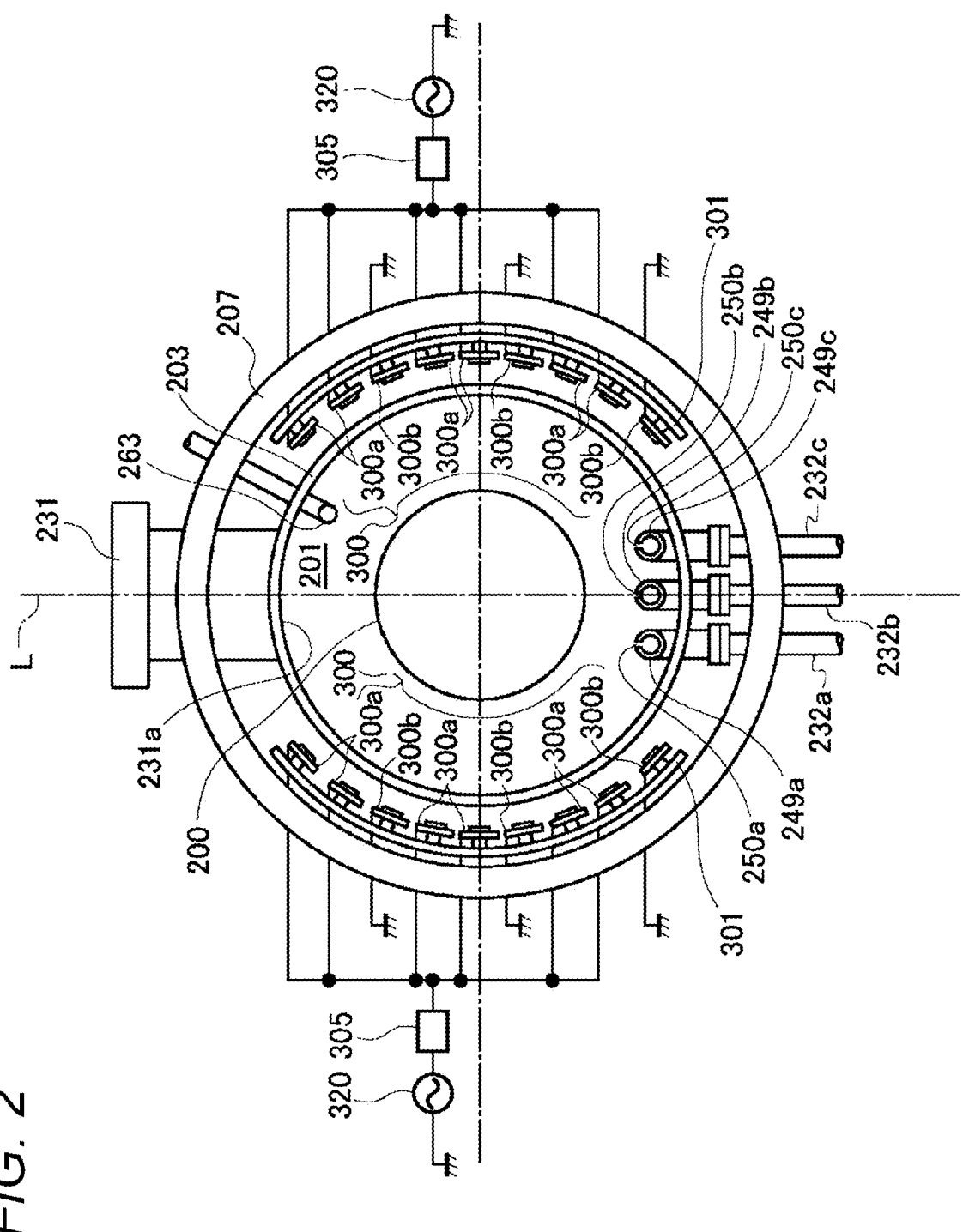
FIG. 2 is a schematic configuration diagram of the vertical process furnace of the film forming apparatus appropriately used in one aspect of the present disclosure, and is a diagram illustrating the process furnace 202 portion as a cross-sectional view taken along the line A-A of FIG. 1.

Hereinafter, a first aspect of the present disclosure will be described mainly with reference to FIGS. 1 to 9. In addition, the drawings used in the following description are all schematic, and dimensional relationships between elements, ratios between elements, and the like illustrated in the drawings do not necessarily coincide with actual ones. In addition, dimensional relationships of the respective elements, ratios of the respective elements, and the like do not necessarily coincide among the plurality of drawings.

(1) Configuration of Film Forming Apparatus

As illustrated in FIG. 1, a process furnace 202 of a film forming apparatus serving as a substrate processing apparatus includes a heater 207 serving as a temperature regulator (heater). The heater 207 has a cylindrical shape and is vertically installed by being supported by a holding plate. The heater 207 also functions as an activator (thermal exciter) that activates (excites) a gas with heat.

Inside the heater 207, a reaction tube 203 is arranged concentrically with the heater 207. The reaction tube 203 is formed of, for example, a heat-resistant material such as quartz ($SiO_2$) or silicon carbide (SiC), and is formed in a cylindrical shape with an upper end closed and a lower end opened. A manifold 209 is arranged below the reaction tube 203 concentrically with the reaction tube 203. The manifold 209 is formed of, for example, a metal material such as stainless steel (SUS), and is formed in a cylindrical shape with an upper end and lower end opened. The upper end of the manifold 209 engages with the lower end of the reaction tube 203 so as to support the reaction tube 203. An O-ring 220a serving as a seal member is provided between the manifold 209 and the reaction tube 203. The reaction tube 203 is vertically installed similarly to the heater 207. A process container (reaction container) is configured mainly by the reaction tube 203 and the manifold 209. A process chamber 201 is formed in a cylindrical hollow portion of the process container. A wafer 200 serving as a substrate can be housed in the process chamber 201. In the process chamber 201, that is, in the process container, processing is performed on the wafer 200.

In the process chamber 201, nozzles 249a to 249c serving as first to third suppliers, respectively, are provided so as to penetrate a side wall of the manifold 209. The nozzles 249a to 249c are also referred to as first to third nozzles, respectively. The nozzles 249a to 249c are formed of, for example, a heat-resistant material such as quartz or SiC. Gas supply pipes 232a to 232c are connected to the nozzles 249a to 249c, respectively. The nozzles 249a to 249c are nozzles different from one another, and the nozzles 249a and 249c are provided adjacent to the nozzle 249b.

In the gas supply pipes 232a to 232c, mass flow controllers (MFCs) 241a to 241c that are flow rate controllers (mass flow control section) and valves 243a to 243c that are opening/closing valves are provided, respectively, in this order from the upstream side of the gas flow. Gas supply pipes 232d to 232f are respectively connected to the downstream sides of the valves 243a to 243c of the gas supply pipes 232a to 232c. In the gas supply pipes 232d to 232f, MFCs 241d to 241f and valves 243d to 243f are provided, respectively, in this order from the upstream side of the gas flow. The gas supply pipes 232a to 232f are formed of, for example, a metal material such as SUS.

As illustrated in FIGS. 1 and 2, the nozzles 249a to 249c are provided in an annular space in plan view between the inner wall of the reaction tube 203 and the wafer 200 so as to extend upward in the arrangement direction of the wafers 200 along the inner wall of the reaction tube 203 from a lower portion to an upper portion. That is, the nozzles 249a to 249c are provided along a wafer arrangement region, in a region horizontally surrounding the wafer arrangement region, on a lateral side of the wafer arrangement region in which the wafers 200 are arranged. In plan view, the nozzle 249b is arranged so as to face an exhaust port 231a, which will be described later, on a straight line with the center of the wafer 200 loaded into the process chamber 201 interposed therebetween. The nozzles 249a and 249c are arranged so as to interpose a straight line L passing through the nozzle 249b and the center of the exhaust port 231a from both sides along the inner wall of the reaction tube 203 (the outer peripheral portion of the wafer 200). The straight line L is also a straight line passing through the nozzle 249b and the center of the wafer 200. That is, it can also be said that the nozzle 249c is provided on a side opposite to the nozzle 249a with the straight line L interposed therebetween. The nozzles 249a and 249c are arranged line-symmetrically, that is, symmetrically with respect to the straight line L as a symmetry axis. Gas supply holes 250a to 250c for supplying gas are provided on side surfaces of the nozzles 249a to 249c, respectively. Each of the gas supply holes 250a to 250c is opened so as to face the exhaust port 231a in plan view, and can supply gas toward the wafer 200. A plurality of gas supply holes 250a to 250c are provided from a lower portion to an upper portion of the reaction tube 203.

From the gas supply pipe 232a, a raw material (source gas) serving as a film-forming agent, which refers to the first film-forming agent, the second film-forming agent or both, is supplied into the process chamber 201 through the MFC 241a, the valve 243a, and the nozzle 249a.

From the gas supply pipe 232b, a nitriding agent (nitriding gas, nitrogen source) serving as a film-forming agent, which refers to the first film-forming agent, the second film-forming agent or both, is supplied into the process chamber 201 through the MFC 241b, the valve 243b, and the nozzle 249b.

From the gas supply pipe 232c, an oxidizing agent (oxidizing gas, oxygen source) serving as a film-forming agent, which refers to the first film-forming agent, the second film-forming agent or both, is supplied into the process chamber 201 through the MFC 241c, the valve 243c, and the nozzle 249c.

Inert gases are supplied from the gas supply pipes 232d to 232f into the process chamber 201 through the MFCs 241d to 241f, the valves 243d to 243f, the gas supply pipes 232a to 232c, and the nozzles 249a to 249c, respectively. The inert gas acts as a purge gas, a carrier gas, a diluent gas, and the like. As described later, an inert gas can be supplied by plasma excitation in the process chamber 201. In this case, the inert gas can also act as a modifying gas, that is, a film-forming agent, which refers to the first film-forming agent, the second film-forming agent or both.

A raw material supplier (source gas supplier) is configured mainly by the gas supply pipe 232a, the MFC 241a, and the valve 243a. A nitriding agent supplier (nitriding source supplier, nitriding gas supplier) is configured mainly by the gas supply pipe 232b, the MFC 241b, and the valve 243b. An oxidizing agent supplier (oxidizing source supplier, oxidizing gas supplier) is configured mainly by the gas supply pipe 232c, the MFC 241c, and the valve 243c. An inert gas supplier is configured mainly by the gas supply pipes 232d to 232f, the MFCs 241d to 241f, and the valves 243d to 243f. At least one of the raw material supplier, the nitriding agent supplier, the oxidizing agent supplier, and the inert gas supplier can also be referred to as a film-forming agent supplier, which refers to a first film-forming agent supplier, a second film-forming agent supplier or both.

Any or all of the above-described various suppliers may be configured as an integrated supplier 248 in which the valves 243a to 243f, the MFCs 241a to 241f, and the like are integrated. The integrated supplier 248 is connected to each of the gas supply pipes 232a to 232f, and is configured such that operations of supplying various substances (various gases) into the gas supply pipes 232a to 232f, that is, opening/closing operations of the valves 243a to 243f, flow rate regulating operations by the MFCs 241a to 241f, and the like are controlled by a controller 121 to be described later. The integrated supplier 248 is configured as an integral or separable integrated unit, and can be attached to and detached from the gas supply pipes 232a to 232f and the like in units of integrated units. Maintenance, replacement, expansion, and the like of the integrated supplier 248 can be performed in units of integrated units.

An exhaust port 231a for exhausting the air in the process chamber 201 is provided below the side wall of the reaction tube 203. As illustrated in FIG. 2, the exhaust port 231a is provided at a position facing the nozzles 249a to 249c and gas supply holes 250a to 250c with the wafer 200 interposed therebetween in plan view. The exhaust port 231a may be provided along the side wall of the reaction tube 203 from the lower portion toward the upper portion, that is, along the wafer arrangement region. An exhaust pipe 231 is connected to the exhaust port 231a. The exhaust pipe 231 is formed of, for example, a metal material such as SUS. A vacuum pump 246 serving as a vacuum exhauster is connected to the exhaust pipe 231 through a pressure sensor 245 serving as a pressure detector (pressure detection section) that detects the pressure in the process chamber 201 and an auto pressure controller (APC) valve 244 serving as a pressure regulator (pressure regulation section). The APC valve 244 is configured to be able to perform vacuum exhaust and stop the vacuum exhaust inside the process chamber 201 by opening/closing the valve in a state in which the vacuum pump 246 is activated, and to be able to regulate the pressure in the process chamber 201 by regulating the degree of valve opening based on pressure information detected by the pressure sensor 245 in a state in which the vacuum pump 246 is activated. The APC valve 244 may also be referred to as an exhaust valve. An exhaust system is configured mainly by the exhaust pipe 231, the APC valve 244, and the pressure sensor 245. The vacuum pump 246 may be included in the exhaust system.

A seal cap 219 serving as a furnace lid capable of airtightly closing a lower end opening of the manifold 209 is provided below the manifold 209. The seal cap 219 is formed of, for example, a metal material such as SUS, and is formed in a disk shape. On the upper surface of the seal cap 219, an O-ring 220b serving as a seal member that is in contact with the lower end of the manifold 209 is provided. A rotator 267 that rotates a boat 217 described later is arranged below the seal cap 219. A rotating shaft 255 of the rotator 267 is formed of a metal material such as SUS, and passes through the seal cap 219 to be connected to the boat 217. The rotator 267 is configured to rotate the wafer 200 by rotating the boat 217. The seal cap 219 is configured to be raised and lowered in the vertical direction by a boat elevator 115 serving as a lifter installed outside the reaction tube 203. The boat elevator 115 is configured as a transferrer that loads and unloads (transfers) the wafer 200 into and out of the process chamber 201 by lifting the seal cap 219.

Below the manifold 209, a shutter 219s serving as a furnace opening lid capable of airtightly closing a lower end opening of the manifold 209 in a state in which the seal cap 219 is lowered to unload the boat 217 out of the process chamber 201 is provided. The shutter 219s is formed of, for example, a metal such as SUS, and is formed in a disk shape. An O-ring 220c serving as a seal member that is in contact with a lower end of the manifold 209 is arranged on an upper surface of the shutter 219s. An opening/closing operation (lifting operation, rotating operation, and the like) of the shutter 219s is controlled by a shutter opener/closer 115s.

The boat 217 serving as a support for supporting the substrate is configured to support a plurality of, for example, 25 to 200 wafers 200 in multiple stages by aligning the wafers 200 in the vertical direction in a horizontal posture and in a state in which the centers thereof are aligned with each other. That is, the boat 217 is configured such that the plurality of wafers 200 are arranged at intervals in the vertical direction in a horizontal posture. The boat 217 is formed of, for example, a heat-resistant material such as quartz or SiC. Heat insulating plates 218 formed of, for example, a heat-resistant material such as quartz or SiC are supported in multiple stages in a lower portion of the boat 217. The boat 217 is configured to be able to support each of the plurality of wafers 200.

A temperature sensor 263 serving as a temperature detector is arranged in the reaction tube 203. By regulating the amount of current supplied to the heater 207 based on temperature information detected by the temperature sensor 263, a desired temperature distribution can be obtained in the process chamber 201. The temperature sensor 263 is provided along the inner wall of the reaction tube 203.

An electrode 300 for plasma generation is provided outside the reaction tube 203, that is, outside the process container (process chamber 201). By applying power to the electrode 300, it is possible to turn gas into plasma and excite the plasma inside the reaction tube 203, that is, inside the process container (process chamber 201), that is, it is possible to excite the gas into a plasma state. Hereinafter, exciting the gas into a plasma state is also simply referred to as plasma excitation. The electrode 300 is configured to generate capacitively coupled plasma (abbreviated as CCP) in the reaction tube 203, that is, in the process container (process chamber 201) by applying power, that is, high frequency power (RF power).

Specifically, as illustrated in FIG. 2, an electrode 300 and an electrode fixture 301 for fixing the electrode 300 are arranged between the heater 207 and the reaction tube 203. The electrode fixture 301 is arranged inside the heater 207, the electrode 300 is arranged inside the electrode fixture 301, and the reaction tube 203 is arranged inside the electrode 300.

In addition, as illustrated in FIGS. 1 and 2, the electrode 300 and the electrode fixture 301 are provided in an annular space in plan view between the inner wall of the heater 207 and the outer wall of the reaction tube 203 so as to extend in the arrangement direction of the wafers 200 from a lower portion to an upper portion of the outer wall of the reaction tube 203. The electrode 300 is provided in parallel with the nozzles 249a to 249c. The electrode 300 and the electrode fixture 301 are arranged in an arc shape concentric with the reaction tube 203 and the heater 207 and in non-contact with the reaction tube 203 and the heater 207 in plan view. Since the electrode fixture 301 is formed of an insulating substance (insulator) and is provided so as to cover at least a part of the electrode 300 and the reaction tube 203, the electrode fixture 301 can also be referred to as a cover (insulating cover, insulating wall, insulating plate) or a cross-sectional arc cover (cross-sectional arc body, cross-sectional arc wall).

Figure 4:
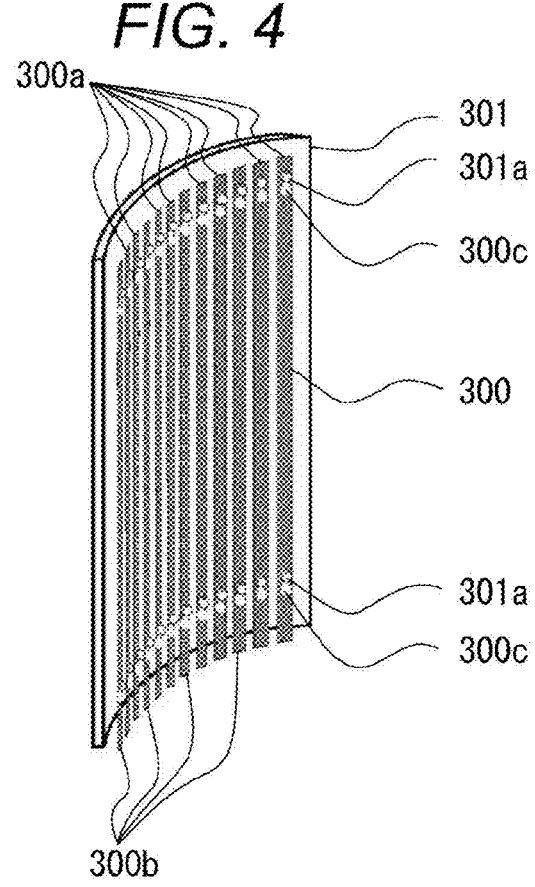
FIG. 4 is a schematic configuration diagram of an electrode unit in the film forming apparatus appropriately used in one aspect of the present disclosure, and is a perspective view illustrating the electrode unit.

As illustrated in FIG. 2, a plurality of electrodes 300 are provided, and the plurality of electrodes 300 are fixed and installed on the inner wall of the electrode fixture 301. More specifically, as illustrated in FIG. 4, a protrusion (hook) 301a capable of hooking the electrode 300 is provided on the inner wall surface of the electrode fixture 301, and the electrode 300 is provided with an opening 300c which is a through-hole through which the protrusion 301a can be inserted. The electrode 300 can be fixed to the electrode fixture 301 by hooking the electrode 300 on the protrusion 301a provided on the inner wall surface of the electrode fixture 301 through the opening 300c. In addition, FIG. 4 illustrates an example in which two openings 300c are provided in one electrode 300 and one electrode 300 is fixed by being hooked on two protrusions 301a, that is, an example in which one electrode 300 is fixed at two locations. FIG. 2 illustrates an example in which nine electrodes 300 are fixed to one electrode fixture 301, and FIG. 4 illustrates an example in which 12 electrodes 300 are fixed to one electrode fixture 301.

The electrode 300 is formed of an oxidation-resistant material such as nickel (Ni). The electrode 300 can be formed of a metal material such as SUS, aluminum (Al), or copper (Cu). However, when the electrode is formed of an oxidation-resistant material such as Ni, a decrease in electric conductivity can be suppressed, and accordingly, a decrease in plasma generation efficiency can be suppressed. In addition, the electrode 300 can be formed of a Ni alloy material to which Al is added. In this case, an aluminum oxide film (AlO film) which is an oxidation film having high heat resistance and corrosion resistance can be formed on the outermost surface of the electrode 300. Since the AlO film formed on the outermost surface of the electrode 300 acts as a protective film (block film, barrier film), it is possible to suppress the progress of degradation inside the electrode 300. As a result, it is possible to further suppress a decrease in plasma generation efficiency due to a decrease in electrical conductivity of the electrode 300. The electrode fixture 301 is formed of an insulating substance (insulator), for example, a heat-resistant material such as quartz or SiC. The material of the electrode fixture 301 is preferably the same as the material of the reaction tube 203.

As illustrated in FIG. 2, the electrode 300 includes a first electrode 300a and a second electrode 300b. The first electrode 300a is connected to a high frequency power supply (RF power supply) 320 through a matcher 305. The second electrode 300b is grounded and has a reference potential (0 V). The first electrode 300a is also referred to as a Hot electrode or a HOT electrode, and the second electrode 300b is also referred to as a Ground electrode or a GND electrode. Each of the first electrode 300a and the second electrode 300b is configured as a plate-like member having a rectangular shape in a front view. At least one first electrode 300a is provided, and at least one second electrode 300b is provided. FIGS. 1, 2, and 4 illustrate examples in which a plurality of first electrodes 300a and a plurality of second electrodes 300b are provided. FIG. 2 illustrates an example in which six first electrodes 300a and three second electrodes 300b are provided in one electrode fixture 301, and FIG. 4 illustrates an example in which eight first electrodes 300a and four second electrodes 300b are provided in one electrode fixture 301. By applying RF power between the first electrode 300a and the second electrode 300b from the RF power supply 320 through the matcher 305, plasma is generated in a region between the first electrode 300a and the second electrode 300b. This region is also referred to as a plasma generation region.

The surface area of the first electrode 300a is preferably 2 times or more and 3 times or less the surface area of the second electrode 300b. When the surface area of the first electrode 300a is less than 2 times the surface area of the second electrode 300b, the spread of the potential distribution may be narrowed to reduce the plasma generation efficiency. When the surface area of the first electrode 300a exceeds 3 times the surface area of the second electrode 300b, the potential distribution may spread to the edge portion of the wafer 200. Therefore, the wafer 200 may become an obstacle and the plasma generation efficiency may be saturated. In addition, in this case, discharge may also occur at the edge portion of the wafer 200, and plasma damage may occur in the wafer 200. By setting the surface area of the first electrode 300a to 2 times or more and 3 times or less the surface area of the second electrode 300b, the plasma generation efficiency can be enhanced to suppress plasma damage to the wafer 200. As illustrated in FIG. 2, the electrodes 300 (first electrode 300a, second electrode 300b) are arranged in an arc shape in plan view, and are arranged at equal intervals, that is, so that distances (gaps) between the adjacent electrodes 300 (first electrode 300a, second electrode 300b) are equal. As described above, the electrodes 300 (first electrode 300a, second electrode 300b) are provided in parallel with the nozzles 249a to 249c.

Here, the electrode fixture 301 and the electrode 300 (first electrode 300a, second electrode 300b) can also be referred to as an electrode unit. As illustrated in FIG. 2, the electrode unit is preferably arranged at a position avoiding the nozzles 249a to 249c, the temperature sensor 263, the exhaust port 231a, and the exhaust pipe 231. FIG. 2 illustrates an example in which two electrode units are arranged so as to face each other with the center of the wafer 200 (reaction tube 203) interposed therebetween while avoiding the nozzles 249a to 249c, the temperature sensor 263, the exhaust port 231a, and the exhaust pipe 231. FIG. 2 illustrates an example in which the two electrode units are arranged line-symmetrically, that is, symmetrically with respect to the straight line L in plan view. By arranging the electrode unit in this manner, the nozzles 249a to 249c, the temperature sensor 263, the exhaust port 231a, and the exhaust pipe 231 can be arranged outside the plasma generation region in the process chamber 201, so that plasma damage to these members, consumption and breakage of these members, and generation of particles from these members can be suppressed.

The electrode 300, that is, the first electrode 300a and the second electrode 300b mainly form an exciter (plasma exciter, plasma activator) for plasma-exciting (activating) a gas. The electrode fixture 301, the matcher 305, and the RF power supply 320 may be included in the plasma exciter.

Figure 3:
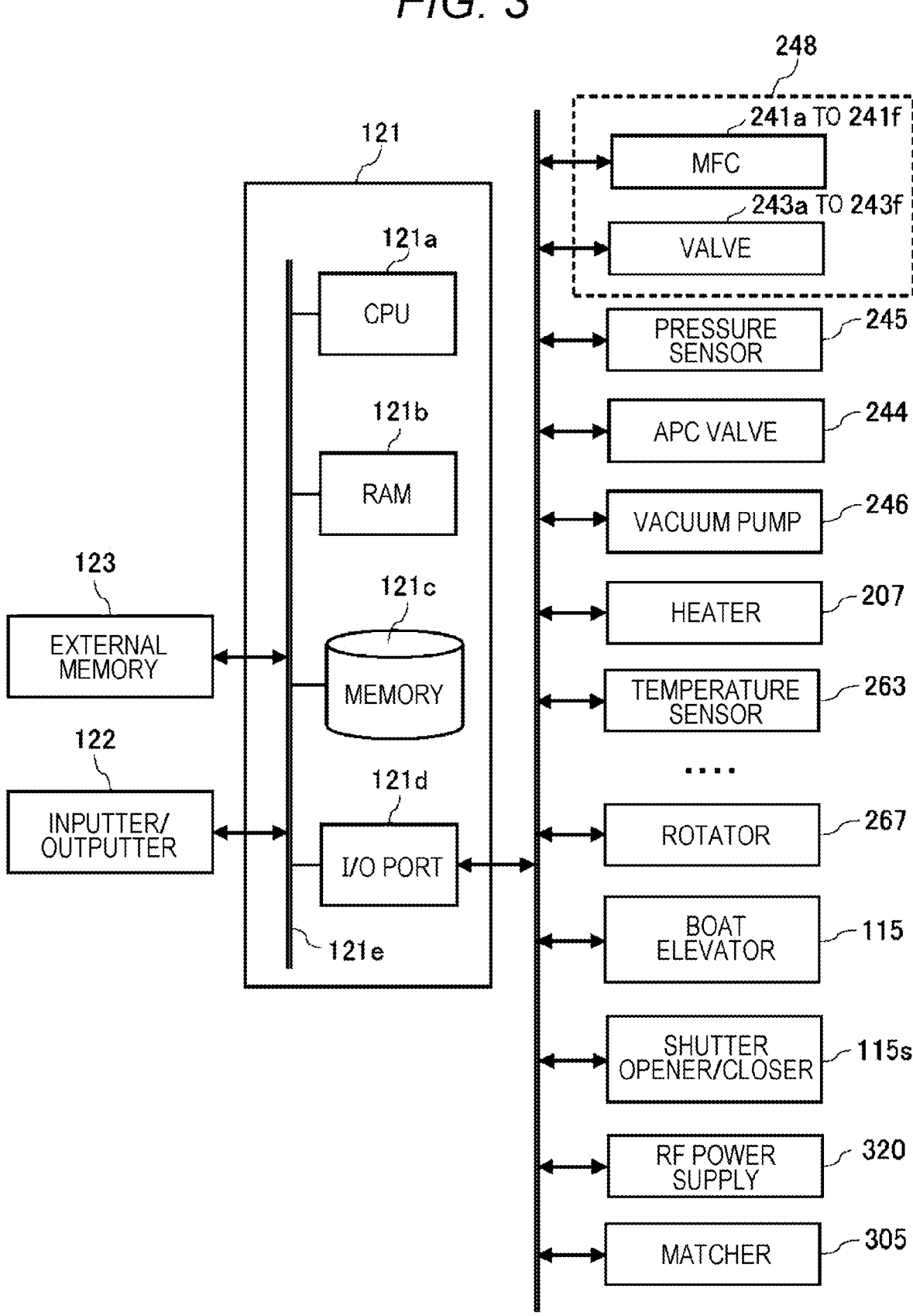
FIG. 3 is a schematic configuration diagram of a controller 121 of the film forming apparatus appropriately used in one aspect of the present disclosure, and is a block diagram illustrating a control system of a controller 121.

As illustrated in FIG. 3, the controller (control means) 121 is configured as a computer including a central processing unit (CPU) 121a, a random access memory (RAM) 121b, a memory 121c, and an I/O port 121d. The RAM 121b, the memory 121c, and the I/O port 121d are configured to be able to exchange data with the CPU 121a through an internal bus 121e. An inputter/outputter 122 formed as, for example, a touch panel and the like is connected to the controller 121. In addition, an external memory 123 can be connected to the controller 121.

The memory 121c includes, for example, a flash memory, a hard disk drive (HDD), a solid state drive (SSD), and the like. In the memory 121c, a control program that controls an operation of the film forming apparatus, a process recipe in which processing procedures, processing conditions, and the like described later are described, and the like are stored to be readable. The process recipe is a combination formed such that the controller 121 causes the film forming apparatus to execute each procedure in processing described later to obtain a predetermined result, and functions as a program. Hereinafter, the process recipe, the control program, and the like are collectively and simply referred to as a program. The process recipe is simply referred to as a recipe. When the term "program" is used in the present specification, this may include the recipe alone, the control program alone, or both of them. The RAM 121b is configured as a memory area (work area) in which the program, data, and the like read by the CPU 121a are temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotator 267, the boat elevator 115, the shutter opener/closer 115s, the RF power supply 320, the matcher 305, and the like.

The CPU 121a is configured to be able to read the control program from the memory 121c and execute the same and read the recipe from the memory 121c in response to an input of an operation command from the inputter/outputter 122. The CPU 121a is configured to be able to control flow rate regulating operations of various gases by the MFCs 241a to 241f, opening and closing operations of the valves 243a to 243f, opening and closing operations of the APC valve 244, and pressure regulating operations by the APC valve 244 based on the pressure sensor 245, start and stop of the vacuum pump 246, temperature regulating operations of the heater 207 based on the temperature sensor 263, rotation and rotation speed regulating operations of the boat 217 by the rotator 267, lifting and lowering operations of the boat 217 by the boat elevator 115, opening and closing operations of the shutter 219s by the shutter opener/closer 115s, impedance regulating operations by the matcher 305, power supply to the RF power supply 320, and the like, in accordance with the contents of the read recipe.

The controller 121 can be configured by installing the above-described program stored in the external memory 123 in a computer. Examples of the external memory 123 include a magnetic disk such as an HDD, an optical disk such as a CD, a magneto-optical disk such as an MO, and a semiconductor memory such as a USB memory or an SSD. The memory 121c or the external memory 123 is formed as a computer-readable recording medium. Hereinafter, these are collectively and simply referred to as recording media. In the present specification, the term "recording medium" may include only the memory 121c alone, may include only the external memory 123 alone, or may include both of them. In addition, the program may be provided to the computer by using a communicator, such as the Internet or a dedicated line, without using the external memory 123.

(2) Film-Forming Process

An example of a process sequence of forming a first nitridation film on the wafer 200 serving as a substrate housed in a process container and forming a second nitridation film on the surface of the first nitridation film attached to the process container, that is, a film-forming sequence will be described as one step of a process of manufacturing a semiconductor device using the above-described film forming apparatus. In the following description, the operation of each section forming the film forming apparatus is controlled by the controller 121.

In the film-forming sequence according to the present aspect, a process of forming a first nitridation film on the wafer 200 by supplying a first film-forming agent to the wafer 200 housed in the process container (first film-forming process), and a process of forming a second nitridation film on a surface of the first nitridation film attached to the process container by supplying a second film-forming agent to the first nitridation film attached to the process container in the first film-forming process (second film-forming process), are performed.

When the first nitridation film having a tensile stress is formed by the first film-forming process, the second nitridation film having a compressive stress is formed by the second film-forming process.

In the present aspect, in the first film-forming process, for example, a raw material and a nitriding agent can be supplied as the first film-forming agent to form the first nitridation film having a tensile stress on the wafer 200. In this case, in the second film-forming process, for example, a raw material, a nitriding agent, and an inert gas excited into a plasma state can be supplied as the second film-forming agent to form a second nitridation film having a compressive stress on the surface of the first nitridation film adhering to the inside of the process container.

Also in the present aspect, for example, the nitriding agent can be excited into a plasma state and supplied in each of the first film-forming process and the second film-forming process.

Figure 5:
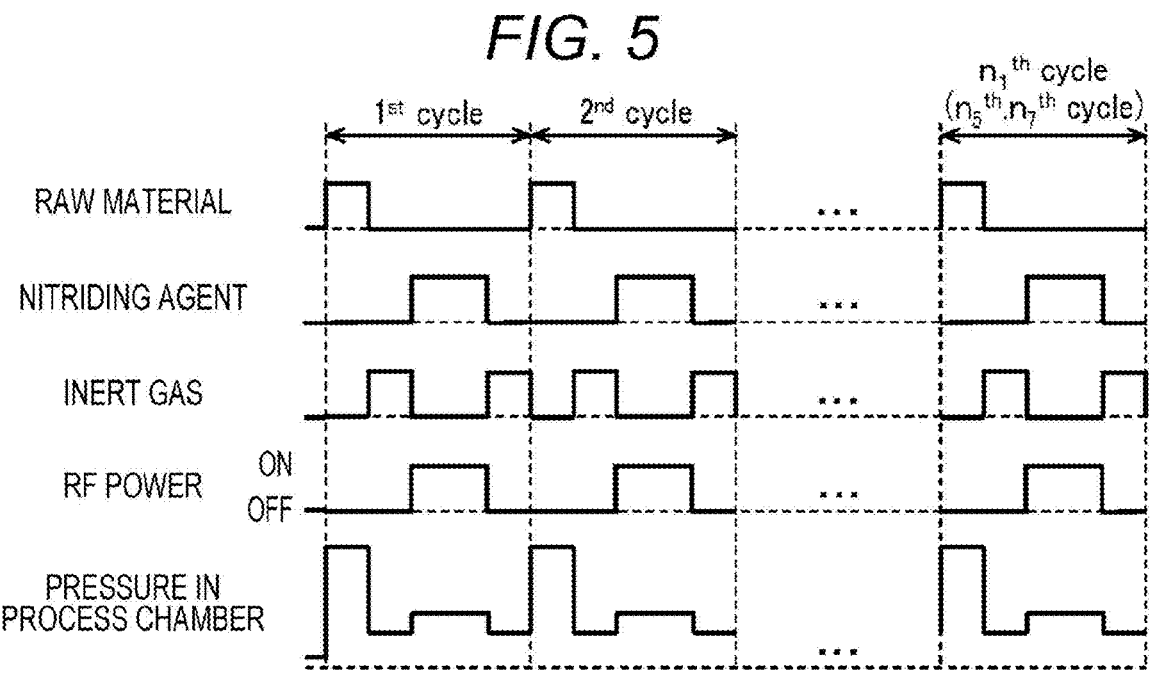
FIG. 5 is a diagram illustrating an example of a process sequence in one aspect of the present disclosure.

In the first film-forming process according to the present aspect, as in the process sequence illustrated in FIG. 5, a cycle in which a step A1 of supplying a raw material to the wafer 200 in the process container and a step A2 of supplying a nitriding agent excited into a plasma state to the wafer 200 in the process container are executed non-simultaneously is performed a predetermined number of times ($n_1$ times, $n_1$ is an integer of 1 or more) to form a first nitridation film having a tensile stress on the wafer 200.

Figure 6:
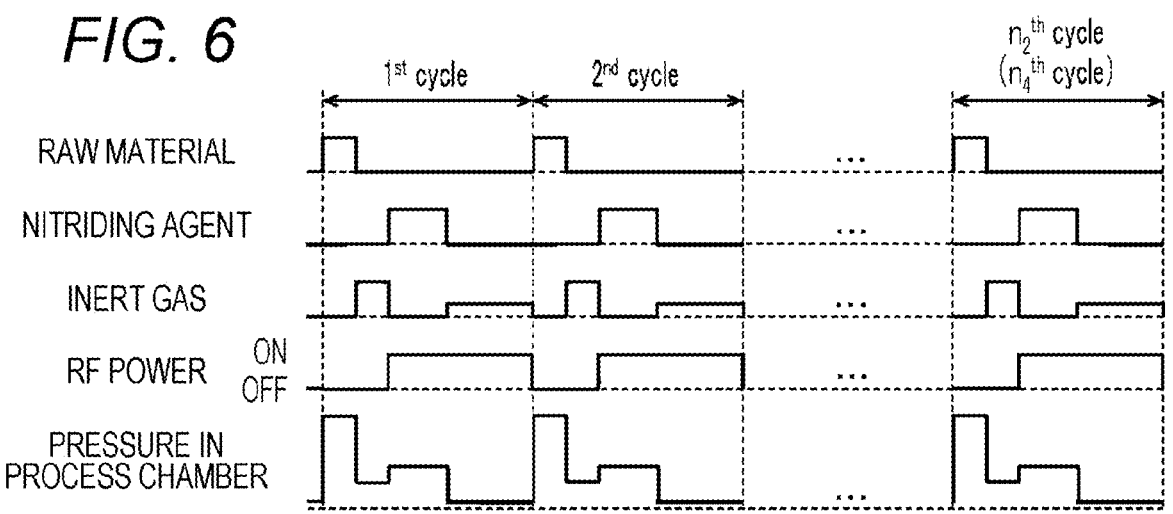
FIG. 6 is a diagram illustrating another example of the process sequence in one aspect of the present disclosure.

In addition, in the second film-forming process according to the present aspect, as in the process sequence illustrated in FIG. 6, a cycle in which a step B1 of supplying a raw material to the first nitridation film adhering to the inside of the process container, a step B2 of supplying a nitriding agent excited into a plasma state to the first nitridation film adhering to the inside of the process container, and a step B3 of supplying an inert gas excited into a plasma state to the first nitridation film adhering to the inside of the process container are executed non-simultaneously is performed a predetermined number of times ($n_2$ times, $n_2$ is an integer of 1 or more) to form a second nitridation film having a compressive stress on the surface of the first nitridation film adhering to the inside of the process container.

In the present specification, such a process sequence (gas supply sequence) may be expressed as follows for convenience. A similar expression will be used in the following description of other aspects, modified examples, and the like.

First film-forming process: (raw material→plasma-excited nitriding agent)×$n_1$

Second film-forming process: (raw material-→plasma-excited nitriding agent-plasma-excited inert gas)×$n_2$ The term "wafer" used in the present specification may mean the wafer itself, or may mean a laminate of a wafer and a predetermined layer or film formed on the surface of the wafer. The term "surface of a wafer" used in the present specification may mean a surface of the wafer itself or a surface of a predetermined layer or the like formed on the wafer. In the present specification, the phrase "forming a predetermined layer on a wafer" means directly forming a predetermined layer on a surface of the wafer itself, or forming a predetermined layer on a layer or the like formed on the wafer. When the term "substrate" is used in the present specification, this is a synonym of the term "wafer".

(2-1) First Film-Forming Process

First, a sequence example of a first film-forming process for forming a first nitridation film having a tensile stress on the wafer 200 will be described.

Wafer Charge

A plurality of wafers 200 are charged into the boat 217 (wafer charge). Thereafter, the shutter 219s is moved by the shutter opener/closer 115s, so that the lower end opening of the manifold 209 is opened (shutter open). The wafer 200 includes a product wafer or a dummy wafer.

Boat Load

Thereafter, as illustrated in FIG. 1, the boat 217 supporting the plurality of wafers 200 is elevated by the boat elevator 115 and is loaded into the process chamber 201 (boat load). In this state, the lower end of the manifold 209 is sealed by the seal cap 219 with the O-ring 220b interposed therebetween.

Pressure Regulation and Temperature Regulation

After the end of boat load, the inside of the process chamber 201, that is, a space in which the wafer 200 is present is vacuum-exhausted (decompression-exhausted) by the vacuum pump 246 so as to have a desired pressure (vacuum degree). At this time, the pressure in the process chamber 201 is measured by the pressure sensor 245, and the APC valve 244 is feedback-controlled based on the measured pressure information (pressure regulation). The wafer 200 in the process chamber 201 is heated by the heater 207 so as to have a desired processing temperature. At this time, the amount of current supplied to the heater 207 is feedback-controlled based on the temperature information detected by the temperature sensor 263 so that a desired temperature distribution is obtained in the process chamber 201 (temperature regulation). In addition, the rotation of the wafer 200 by the rotator 267 is started. Both the exhaust in the process chamber 201 and the heating and rotation of the wafer 200 are continuously performed at least until the processing on the wafer 200 ends.

Film-Forming Process

Thereafter, the following steps A1 and A2 are sequentially executed.

Step A1

In step A1, a raw material (source gas) is supplied to the wafer 200 in the process chamber 201.

Specifically, the valve 243a is opened to allow the raw material to flow into the gas supply pipe 232a. The flow rate of the source gas is regulated by the MFC 241a, and the source gas is supplied into the process chamber 201 through the nozzle 249a and exhausted from the exhaust port 231a. At this time, the raw material is supplied to the wafer 200 from the lateral side of the wafer 200 (source supply). At that time, the valves 243d to 243f may be opened to supply inert gas into the process chamber 201 through the nozzles 249a to 249c.

As processing conditions in this step,
    processing temperature: 250 to 550° C., preferably 400 to 500° C.
    processing pressure: 100 to 4000 Pa, preferably 100 to 1000 Pa
    source gas supply flow rate: 0.1 to 3 slm
    source gas supply time: 1 to 100 seconds, preferably 1 to 30 seconds
    inert gas supply flow rate (per gas supply pipe): 0 to 10 slm is exemplified.

In addition, in the present specification, the expression of a numerical range such as "250 to 550° C." means that a lower limit value and an upper limit value are included in the range. Therefore, for example, "250 to 550° C." means "250° C. or more and 550° C. or less". The same applies to other numerical ranges. In this specification, the processing temperature means the temperature of the wafer 200 or the temperature in the process chamber 201, and the processing pressure means the pressure in the process chamber 201. The gas supply flow rate: 0 slm means a case where the gas is not supplied. The same applies to the following description.

By supplying, for example, a chlorosilane-based gas to the wafer 200 as a raw material under the above-described processing conditions, an Si-containing layer containing Cl is formed on the outermost surface of the wafer 200 serving as a base. The Si-containing layer containing Cl is formed on the outermost surface of the wafer 200 by physical adsorption or chemical adsorption of molecules of the chlorosilane-based gas, physical adsorption or chemical adsorption of molecules of a substance obtained by partially decomposing the chlorosilane-based gas, deposition of Si due to thermal decomposition of the chlorosilane-based gas, or the like. The Si-containing layer containing Cl may be an adsorption layer (physical adsorption layer or chemical adsorption layer) of molecules of the chlorosilane-based gas or molecules of a substance obtained by partially decomposing the chlorosilane-based gas, or may be a deposited layer of Si containing Cl. In the present specification, the Si-containing layer containing Cl is also simply referred to as an Si-containing layer. Under the above-described processing conditions, physical adsorption or chemical adsorption of molecules of the chlorosilane-based gas or molecules of a substance obtained by partially decomposing the chlorosilane-based gas on the outermost surface of the wafer 200 occurs predominantly (preferentially), and deposition of Si due to thermal decomposition of the chlorosilane-based gas slightly occurs or hardly occurs. That is, under the above-described processing conditions, the Si-containing layer includes an adsorption layer, which includes at least one of a physical adsorption layer and a chemical adsorption layer, of molecules of the chlorosilane-based gas or molecules of a substance obtained by partially decomposing the chlorosilane-based gas in an overwhelmingly large amount, and slightly or hardly includes a deposited layer of Si containing Cl.

After the Si-containing layer is formed, the valve 243a is closed to stop supplying the raw material into the process chamber 201. Then, the inside of the process chamber 201 is vacuum-exhausted to remove the gas and the like remaining in the process chamber 201 from the inside of the process chamber 201 (purge). At this time, the valves 243d to and 243f are opened to supply the inert gas into the process chamber 201. The inert gas acts as a purge gas. The inside of the process chamber 201 is purged under a non-plasma atmosphere. As a result, it is possible to suppress mixing of the raw material remaining in the process chamber 201 and the nitriding agent supplied into the process chamber 201 in step A2, an unintended reaction (for example, gas phase reaction or plasma gas phase reaction) due to the mixing, generation of particles, and the like.

As processing conditions in the purge,
    processing temperature: 250 to 550° C., preferably 400 to 500° C.
    processing pressure: 1 to 20 Pa
    inert gas supply flow rate (per gas supply pipe): 0.05 to 20 slm
    inert gas supply time: 1 to 200 seconds, preferably 1 to 40 seconds is exemplified.

As the raw material, for example, a silane-based gas containing silicon (Si) serving as a main element that forms a film formed on the wafer 200 can be used. As the silane-based gas, for example, a gas containing a halogen and Si, that is, a halosilane-based gas can be used. Halogen includes chlorine (Cl), fluorine (F), bromine (Br), iodine (I), and the like. As the halosilane-based gas, for example, the above-described chlorosilane-based gas containing Cl and Si can be used.

As the raw material, for example, a chlorosilane-based gas such as a monochlorosilane (SiH$_3$Cl, abbreviated as MCS) gas, a dichlorosilane (SiH$_2$Cl$_2$, abbreviated as DCS) gas, a trichlorosilane (SiHCl$_3$, abbreviated as TCS) gas, a tetrachlorosilane (SiCl$_4$, abbreviated as 4CS) gas, a hexachlorodisilane ($Si_2Cl_6$, abbreviated as HCDS) gas, or an octachlorotrisilane ($Si_3Cl_8$, abbreviated as OCTS) gas can be used. One or more of these can be used as a raw material.

As the raw material, in addition to the chlorosilane-based gas, for example, a fluorosilane-based gas such as a tetrafluorosilane ($SiF_4$) gas or a difluorosilane ($SiH_2F_2$) gas, a bromosilane-based gas such as a tetrabromosilane (SiBra) gas or a dibromosilane ($SiH_2Br_2$) gas, or an iodosilane-based gas such as a tetraiodosilane ($SiI_4$) gas or a diiodosilane ($SiH_2I_2$) gas can also be used. One or more of these can be used as a raw material.

As the raw material, in addition to these gases, for example, a gas containing an amino group and Si, that is, an aminosilane-based gas can also be used. The amino group is a monovalent functional group obtained by removing hydrogen (H) from ammonia, a primary amine, or a secondary amine, and can be represented as $-NH_2$, $-NHR$, or $-NR_2$. Here, R represents an alkyl group, and two Rs in $-NR_2$ may be the same or different.

As the raw material, for example, an aminosilane-based gas such as a tetrakis (dimethylamino) silane ($Si[N(CH_3)_2]_4$, abbreviated as 4DMAS) gas, a tris (dimethylamino) silane ($Si[N(CH_3)_2]_3H$, abbreviated as 3DMAS) gas, a bis (diethylamino) silane ($Si[N(C_2H_5)_2]_2H_2$, abbreviated as BDEAS) gas, a bis (tertiarybutylamino) silane ($SiH_2[NH(C_4H_9)]_2$, abbreviated as BTBAS) gas, or a (diisopropylamino) silane ($SiH_3[N(C_3H_7)_2]$, abbreviated as DIPAS) gas can also be used. One or more of these can be used as a raw material.

As the inert gas, for example, a rare gas such as a nitrogen ($N_2$) gas, an argon (Ar) gas, a helium (He) gas, a neon (Ne) gas, a xenon (Xe) gas, a krypton (Kr) gas, or a radon (Rn) gas can be used. One or more of these gases can be used as the inert gas. The same applies to each step described later.

Step A2

After the end of step A1, a nitriding agent is plasma-excited and supplied to the wafer 200 in the process chamber 201, that is, the Si-containing layer formed on the wafer 200.

Specifically, the valve 243b is opened to allow the nitriding agent to flow into the gas supply pipe 232b. The flow rate of the nitriding agent is regulated by the MFC 241b, and the nitriding agent is supplied into the process chamber 201 through the nozzle 249b and exhausted from the exhaust port 231a. At this time, the nitriding agent is supplied to the wafer 200 from the lateral side of the wafer 200 (nitriding agent supply). At that time, the valves 243d to 243f may be opened to supply the inert gas into the process chamber 201 through the nozzles 249a to 249c.

At this time, by applying RF power between the first electrode 300a and the second electrode 300b, plasma is generated in a region between the first electrode 300a and the second electrode 300b. As a result, the nitriding agent can be plasma-excited, and active species X generated by plasma-exciting the nitriding agent is supplied to the wafer 200 (plasma-excited nitriding agent supply). At this time, a nitriding agent containing the active species X is supplied to the wafer 200.

For example, when a gas containing nitrogen (N) and hydrogen (H) is used as a nitriding agent, the gas containing N and H is excited into a plasma state to generate the active species X such as $NH_x*$ (x is an integer of 1 to 3), and the active species X are supplied to the wafer 200 (supply of plasma-excited gas containing N and H). In this case, the gas containing N and H that contains the active species X, such as $NH*$, $NH_2*$, and $NH_3*$, is supplied to the wafer 200. In addition, * means a radical. The same applies to the following description.

In addition, a period during which the nitriding agent is supplied to the wafer 200 without plasma excitation may be set before the nitriding agent is supplied by plasma excitation. That is, before supplying the plasma-excited nitriding agent to the wafer 200, a non-plasma-excited nitriding agent may be supplied, that is, a non-plasma-excited nitriding agent may be preflowed (non-plasma-excited nitriding agent preflow). In this case, first, the nitriding agent may be supplied without plasma excitation, and after the elapse of a predetermined period, RF power may be applied between the first electrode 300a and the second electrode 300b in a state in which the supply of the nitriding agent is continued. This makes it possible to generate more stable plasma and active species.

As processing conditions in this step, processing temperature: 250 to 550° C., preferably 400 to 500° C.

processing pressure: 2 to 100 Pa, preferably 20 to 70 Pa nitriding agent supply flow rate: 0.1 to 10 slm nitriding agent supply time: 10 to 200 seconds, preferably 1 to 50 seconds inert gas supply flow rate (per gas supply pipe): 0 to 10 slm RF power: 100 to 1000 W RF frequency: 13.56 MHz or 27 MHz is exemplified.

By plasma-exciting a nitriding agent and supplying the nitriding agent to the wafer 200 under the above-described processing conditions, at least a part of the Si-containing layer formed on the wafer 200 is nitrided (modified). As a result, a silicon nitride layer (SiN layer) is formed on the outermost surface of the wafer 200 serving as a base as a layer containing Si and N. When the SiN layer is formed, impurities contained in the Si-containing layer, such as Cl, form a gaseous substance containing at least Cl in the process of the modification reaction of the Si-containing layer by the plasma-excited nitriding agent, and are discharged from the inside of the process chamber 201. Therefore, the SiN layer becomes a layer containing fewer impurities such as Cl than the Si-containing layer formed in step A1.

After the SiN layer is formed, the valve 243b is closed to stop the supply of the nitriding agent into the process chamber 201, and the gas and the like remaining in the process chamber 201 are removed from the process chamber 201 (purge) by the same processing procedure as in step A1.

As the nitriding agent, for example, an N and H-containing gas can be used. The N and H-containing gas is an N-containing gas and an H-containing gas. The nitriding agent preferably has an N—H bond.

As the nitriding agent, for example, a hydrogen nitride-based gas such as an ammonia ($NH_3$) gas, a diazene ($N_2H_2$) gas, a hydrazine ($N_2H_4$) gas, or an $N_3H_8$ gas can be used. One or more of these gases can be used as a nitriding agent.

In addition to these, for example, nitrogen (N), carbon (C), and hydrogen (H)-containing gases can also be used as the nitriding agent. As the N, C, and H-containing gas, for example, an amine-based gas or an organic hydrazine-based gas can be used. The N, C, and H-containing gas is an N-containing gas, a C-containing gas, an H-containing gas, and an N and C-containing gas.

As the nitriding agent, for example, an ethylamine-based gas such as a monoethylamine ($C_2H_5NH_2$, abbreviated as MEA) gas, a diethylamine (($C_2H_5)_2NH$, abbreviated as DEA) gas, and a triethylamine ($(C_2H_5)_3N$, abbreviated as TEA) gas, a methylamine-based gas such as a monomethylamine ($CH_3NH_2$, abbreviated as MMA) gas, a dimethylamine ($(CH_3)_2NH$, abbreviated as DMA) gas, and a trimethylamine ($(CH_3)_3N$, abbreviated as TMA) gas, and an organic hydrazine-based gas such as a monomethylhydrazine ($(CH_3)HN_2H_2$, abbreviated as MMH) gas, a dimethylhydrazine ($(CH_3)_2N_2H_2$, abbreviated as DMH) gas, and a trimethylhydrazine ($(CH_3)_2N_2(CH_3)H$, abbreviated as TMH) gas may be used. One or more of these gases can be used as a nitriding agent.

Cycle Is Performed Predetermined Number Of Times

By performing a cycle in which steps A1 and A2 described above are executed non-simultaneously, that is, without synchronization, a predetermined number of times ($n_1$ times, $n_1$ is an integer of 1 or more), the surface of the wafer 200 can be used as a base, and a silicon nitridation film (SiN film) having a predetermined thickness can be formed as a first nitridation film on the base, for example. The cycle described above is preferably repeated a plural number of times. That is, it is preferable to make the SiN layer formed per cycle thinner than a desired film thickness and repeat the above-described cycle a plural number of times until the thickness of the SiN film formed by stacking the SiN layer becomes the desired thickness. When an N, C, and H-containing gas is used as a nitriding agent, in step A2, for example, a silicon carbonitride layer (SiCN layer) can also be formed, and, for example, a silicon carbonitridation film (SiCN film) can also be formed on the surface of the wafer 200 as a nitridation film by performing the above-described cycle a predetermined number of times.

The first nitridation film formed by the above-described processing procedures and processing conditions has a predetermined tensile stress.

After-Purge and Return to Atmospheric Pressure

After the end of the process of forming the first nitridation film having a desired thickness on the wafer 200, an inert gas is supplied as a purge gas from each of the nozzles 249a to 249c into the process chamber 201, and is exhausted from the exhaust port 231a. As a result, the inside of the process chamber 201 is purged, and a gas and a reaction by-product remaining in the process chamber 201 are removed from the inside of the process chamber 201 (after-purge). Thereafter, the air in the process chamber 201 is replaced with the inert gas (inert gas replacement), so that the pressure in the process chamber 201 is returned to a normal pressure (return to atmospheric pressure).

Boat Unload

Thereafter, the boat elevator 115 lowers the seal cap 219 to open the lower end of the manifold 209. Then, the processed wafer 200 is unloaded from the lower end of the manifold 209 to the outside of the reaction tube 203 in a state of being supported by the boat 217 (boat unload). After the boat unload, the shutter 219s is moved, and the lower end opening of the manifold 209 is sealed by the shutter 219s through the O-ring 220c (shutter close).

Wafer Cooling

After the boat unload, that is, after the shutter close, the processed wafer 200 is cooled to predetermined temperature at which the wafer can be taken out in a state of being supported by the boat 217 (wafer cooling).

Wafer Discharge

After the wafer cooling, the processed wafer 200 cooled to predetermined temperature at which the wafer can be taken out is taken out of the boat 217 (wafer discharge).

In this manner, the first film-forming process for forming the first nitridation film on the wafer 200 ends. This processing is performed a predetermined number of times (one or more times).

(2-2) Second Film Forming Processing

Figure 8:
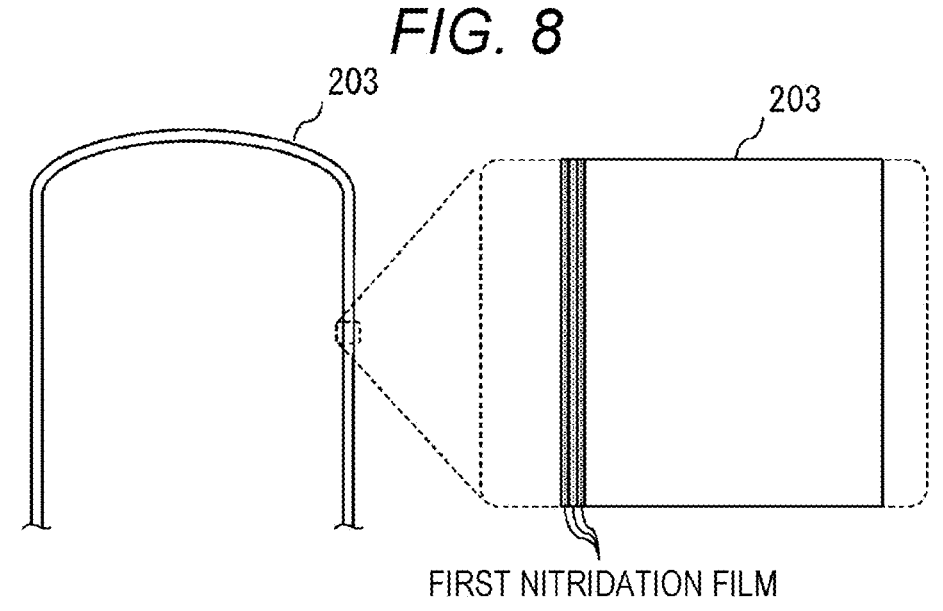
FIG. 8 is a partially enlarged cross-sectional view of the inner wall of a process container to which a first nitridation film adheres.

When the first film-forming process is performed, the first nitridation film also adheres to the surface of the member in the process container, for example, the inner wall surface of the reaction tube 203, the surface of the boat 217, or the like. FIG. 8 schematically illustrates a partially enlarged cross-sectional view of the inner wall of the process container to which the first nitridation film adheres, that is, the inner wall of the reaction tube 203 when the first film-forming process is repeatedly performed. The first nitridation film has a predetermined stress (tensile stress in the present aspect), and when the cumulative film thickness increases by repeatedly performing the first film forming processing, the first nitridation film may be cracked and peeled off from the surface of the member due to this stress, and foreign matters (particles) may be generated in the furnace. Therefore, after the first film-forming process is performed, a second nitridation film having a predetermined stress (compressive stress in the present aspect) is formed on the surface of the first nitridation film adhering to the inside of the process container at a predetermined timing, and a second film-forming process for reducing the stress of the film is performed.

Hereinafter, a sequence example of the second film-forming process for forming the second nitridation film having a compressive stress on the surface of the first nitridation film adhering to the inside of the process container will be described. Also in the following description, the operation of each section included in the substrate processing apparatus is controlled by the controller 121.

Empty Boat Load

The shutter 219s is moved by the shutter opener/closer 115s to open the lower end opening of the manifold 209 (shutter open). Thereafter, the empty boat 217 having the first nitridation film adhering to its surface, that is, the boat 217 not holding the wafer 200 is lifted up by the boat elevator 115 and loaded into the process container having the first nitridation film adhering to its surface, that is, into the process chamber 201 (empty boat load). In this state, the lower end of the manifold 209 is sealed by the seal cap 219 with the O-ring 220b interposed therebetween.

Pressure Regulation and Temperature Regulation

After the end of the empty boat load, the inside of the process chamber 201 is vacuum-exhausted (decompression-exhausted) by the vacuum pump 246 so as to have a desired pressure (degree of vacuum). At this time, the pressure in the process chamber 201 is measured by the pressure sensor 245, and the APC valve 244 is feedback-controlled based on the measured pressure information (pressure regulation). In addition, the inside of the process chamber 201 is heated by the heater 207 so as to have a desired processing temperature. At this time, the amount of current supplied to the heater 207 is feedback-controlled based on the temperature information detected by the temperature sensor 263 so that a desired temperature distribution is obtained in the process chamber 201 (temperature regulation). In addition, the rotation of the empty boat 217 by the rotator 254 is started. The operation of the vacuum pump 246, the heating of the inside of the process chamber 201, and the rotation of the boat 217 are all continuously performed until the second film-forming process ends. The boat 217 may not be rotated.

Film-Forming Process

Thereafter, the following steps B1, B2, and B3 are sequentially executed.

Step B1

In step B1, a raw material is supplied to the first nitridation film adhering to the inside of the process container under the same processing procedures and processing conditions as in the raw material supply in step A1 (raw material supply). By performing this step, the Si-containing layer is formed on the surface of the first nitridation film adhering to the inside of the process container.

After the Si-containing layer is formed, the supply of the raw material into the process chamber 201 is stopped, and a gas and the like remaining in the process chamber 201 are removed from the inside of the process chamber 201 by processing procedures similar to the purge in step A1 (purge).

Step B2

After the end of step B1, a nitriding agent is plasma-excited and supplied to the Si-containing layer formed on the surface of the first nitridation film adhering to the inside of the process container under the same processing procedures and processing conditions as in the supply of the plasma-excited nitriding agent in step A2 (supply of the plasma-excited nitriding agent). By performing this step, the SiN layer is formed on the surface of the first nitridation film adhering to the inside of the process container.

After the SiN layer is formed, the supply of the nitriding agent into the process chamber 201 is stopped. Thereafter, step B3 is executed. However, before step B3, the inside of the process chamber 201 may be purged under a non-plasma atmosphere. In this case, the gas and the like remaining in the process chamber 201 can be removed from the inside of the process chamber 201 by processing procedures similar to the purge in step A1 (purge). As a result, it is possible to suppress mixing of the plasma-excited nitriding agent remaining in the process chamber 201 and the plasma-excited inert gas supplied into the process chamber 201 in step B3, an unintended reaction (for example, plasma gas phase reaction) due to the mixing, generation of particles, and the like.

Step B3

After the end of step B2, an inert gas is plasma-excited and supplied to the SiN layer formed on the surface of the first nitridation film.

Specifically, the valves 243d to 243f are opened to allow the inert gas to flow into the gas supply pipes 232d to 232f, respectively. The flow rate of the inert gas is regulated by the MFCs 241d to 241f, and the inert gas is supplied into the process chamber 201 through the nozzles 249a to 249c and exhausted from the exhaust port 231a. At this time, the inert gas is supplied to the wafer 200 from the side of the wafer 200 (inert gas supply).

At this time, by applying RF power between the first electrode 300a and the second electrode 300b, plasma is generated in a region between the first electrode 300a and the second electrode 300b. As a result, the inert gas can be plasma-excited, and active species Y generated by plasma-exciting the inert gas is supplied to the SiN layer formed on the surface of the first nitridation film (plasma-excited inert gas supply). At this time, an inert gas containing the active species Y is supplied to the SiN layer formed on the surface of the first nitridation film.

For example, when an $N_2$ gas is used as an inert gas, the $N_2$ gas is plasma-excited to generate the active species Y such as $N_x^*$ (x is an integer of 1 to 2), and the active species Y are supplied to the wafer 200 (plasma-excited $N_2$ gas supply). In this case, the $N_2$ gas containing the active species Y such as $N^*$ and $N_2^*$ is supplied to the wafer 200.

For example, when an Ar gas is used as an inert gas, the Ar gas is plasma-excited to generate the active species Y such as $Ar^*$, and the active species Y are supplied to the wafer 200 (plasma-excited Ar gas supply). In this case, the Ar gas containing the active species Y such as $Ar^*$ is supplied to the wafer 200.

For example, when a He gas is used as an inert gas, the He gas is plasma-excited to generate the active species Y such as $He^*$, and the active species Y are supplied to the wafer 200 (plasma-excited He gas supply). At this time, the He gas containing the active species Y such as $He^*$ is supplied to the wafer 200.

As the inert gas, these can be mixed in the process chamber 201 and used as a mixed gas. For example, as an inert gas, a mixed gas of $N_2$ gas and Ar gas can be used, a mixed gas of $N_2$ gas and He gas can be used, or a mixed gas of $N_2$ gas, Ar gas, and He gas can be used.

In addition, a period during which an inert gas is supplied without plasma excitation may be set before the inert gas is plasma-excited and supplied to the SiN layer formed on the surface of the first nitridation film. That is, the non-plasma-excited inert gas may be supplied to the SiN layer formed on the surface of the first nitridation film before the plasma-excited inert gas is supplied, that is, the non-plasma-excited inert gas may be preflowed (non-plasma-excited inert gas preflow). In this case, first, an inert gas may be supplied without plasma excitation, and after the elapse of a predetermined period, RF power may be applied between the first electrode 300a and the second electrode 300b in a state in which the supply of the inert gas is continued. This makes it possible to generate more stable plasma and active species.

As processing conditions in this step, processing temperature: 250 to 550° C., preferably 400 to 500° C.

processing pressure: 2 to 6 Pa, preferably 2.66 to 5.32 Pa, more preferably 3 to 4 Pa inert gas supply flow rate (per gas supply pipe): 0.01 to 2 slm inert gas supply time: 1 to 300 seconds, preferably 10 to 60 seconds RF power: 100 to 1000 W RF frequency: 13.56 MHz or 27 MHZ are exemplified.

By plasma-exciting and supplying an inert gas into the process container under the above-described processing conditions, the SiN layer formed on the surface of the first nitridation film is modified. At this time, impurities such as Cl remaining in the SiN layer form a gaseous substance containing at least Cl and the like in the process of the modification reaction of the SiN layer using the active species Y, and are discharged from the process chamber 201. As a result, the SiN layer modified in this step becomes a layer containing less impurities such as Cl than the SiN layer formed in step B2. In addition, due to this modification, the SiN layer after being modified in this step has a shorter interatomic distance between Si and N contained in the layer than the SiN layer formed in step B2. As a result, the SiN layer is densified, and the SiN layer after the modification in this step has a higher density than the SiN layer formed in step B2.

In addition, due to the modification reaction by the nitriding agent in step B2, the content of impurities such as Cl in the SiN layer formed in step B2 is reduced to be smaller than the content of impurities such as Cl in the Si-containing layer formed in step B1. However, in the SiN layer formed in step B2, impurities such as Cl of, for example, about several atom % may remain without being completely removed by the modification reaction by the nitriding agent. In this step, impurities such as Cl remaining in the SiN layer that cannot be completely removed by the modification reaction by the nitriding agent can be removed by the active species Y.

After the end of the modification processing of the SiN layer, the application of the RF power to the electrode 300 is stopped to stop the supply of the plasma-excited inert gas into the process container. When the above-described cycle is repeated a plural number of times, step B1 is performed again after the end of step B3. However, before step B1 is performed, the inside of the process chamber 201 may be purged under a non-plasma atmosphere. In this case, the gas and the like remaining in the process chamber 201 can be removed from the inside of the process chamber 201 by processing procedures similar to the purge in step B1 (purge). As a result, it is possible to suppress mixing of the plasma-excited inert gas remaining in the process chamber 201 and the raw material supplied into the process chamber 201 in step B1, an unintended reaction (for example, gas phase reaction or plasma gas phase reaction) due to the mixing, generation of particles, and the like.

As the inert gas, for example, an $N_2$ gas or a rare gas such as an Ar gas, a He gas, a Ne gas, a Xe gas, a Kr gas, or an Rn gas can be used. One or more of these gases can be used as the inert gas.

Cycle Is Performed Predetermined Number Of Times

By performing a cycle in which steps B1, B2, and B3 described above are executed not simultaneously, that is, without synchronization, a predetermined number of times ($n_2$ times, $n_2$ is an integer of 1 or more), for example, an SiN film having a desired thickness can be formed as a second nitridation film on the surface of the first nitridation film adhering to the inside of the process container. The cycle described above is preferably repeated a plural number of times. That is, it is preferable to make the SiN layer formed per cycle thinner than a desired film thickness and repeat the above-described cycle a plural number of times until the thickness of the SiN film formed by stacking the SiN layer becomes the desired thickness. When an N, C, and H-containing gas is used as a nitriding agent, in step B2, for example, an SiCN layer can also be formed, and, for example, an SiCN film can also be formed on the surface of the wafer 200 as a nitridation film by performing the above-described cycle a predetermined number of times.

The second nitridation film formed by the above-described processing procedures and processing conditions has a compressive stress of a predetermined magnitude.

After-Purge and Return to Atmospheric Pressure

After the end of the process of forming the second nitridation film on the surface of the first nitridation film, an inert gas is supplied as a purge gas from each of the nozzles 249a to 249c into the process chamber 201, and is exhausted from the exhaust port 231a. As a result, the inside of the process chamber 201 is purged, and a gas and a reaction by-product remaining in the process chamber 201 are removed from the inside of the process chamber 201 (after-purge). Thereafter, the air in the process chamber 201 is replaced with the inert gas (inert gas replacement), so that the pressure in the process chamber 201 is returned to a normal pressure (return to atmospheric pressure).

Empty Boat Unload

Thereafter, the boat elevator 115 lowers the seal cap 219 to open the lower end of the manifold 209. Then, the empty boat 217 having the second nitridation film formed on its surface is unloaded from the lower end of the manifold 209 to the outside of the reaction tube 203 (empty boat unload). After the empty boat unload, the shutter 219s is moved, and the lower end opening of the manifold 209 is sealed by the shutter 219s through the O-ring 220c (shutter close).

Figure 9:
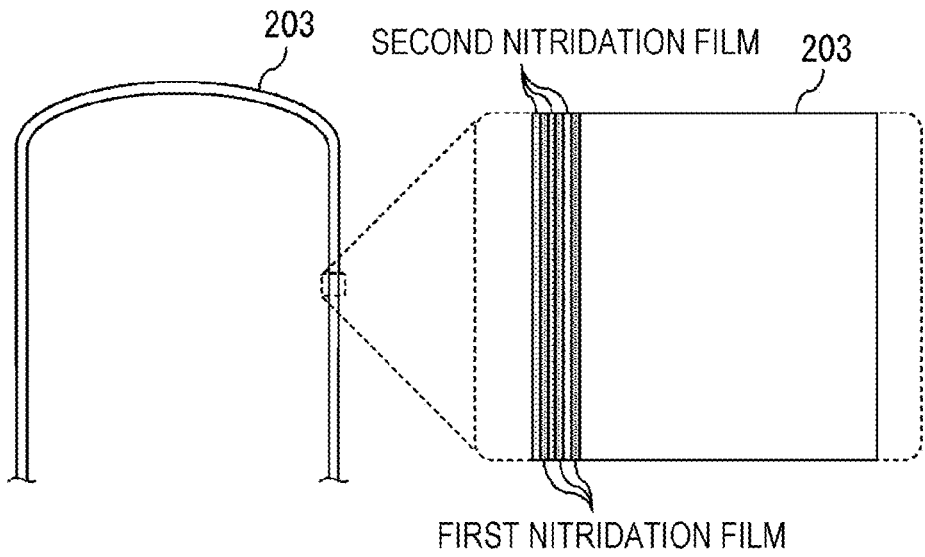
FIG. 9 is a partially enlarged cross-sectional view of an inner wall of a process container to which a laminated film formed by alternately laminating a first nitridation film and a second nitridation film adheres.

In this manner, the second film-forming process for forming the second nitridation film on the surface of the first nitridation film adhering to the inside of the process container ends. This processing may be performed every time the first film-forming process is performed once, or may be performed every time the first film-forming process is performed a plural number of times. FIG. 9 schematically illustrates a partially enlarged cross-sectional view of an inner wall of the process container to which the laminated film formed by alternately laminating the first nitridation film and the second nitridation film adheres by alternately and repeatedly performing the first film-forming process and the second film-forming process, that is, an inner wall of the reaction tube 203.

(3) Effects of Present Aspect

According to the present aspect, the following one or more effects can be obtained.

(a) When the first nitridation film having a tensile stress is formed by the first film-forming process, the second nitridation film having a compressive stress is formed by the second film-forming process to reduce the stress of the film adhering to the inside of the process container, so that the cumulative film thickness at which film peeling occurs can be increased. Therefore, the cleaning cycle (maintenance cycle) can be extended to shorten the downtime of the film forming apparatus. As a result, it is possible to improve the productivity of the film-forming process. In addition, since the film adhering to the inside of the process container is less likely to be peeled off, generation of particles can be suppressed. As a result, it is possible to improve the quality of the film formed on the wafer 200 and accordingly improve the yield rate greatly.

In addition, a method can also be considered in which, when a nitridation film having a tensile stress is formed by the first film-forming process, an oxidation film having a compressive stress is formed by the second film-forming process to reduce the stress of the film adhering to the inside of the process container.

However, when the oxidation film is formed by the second film-forming process, it is necessary to prepare an oxidizing agent supplier, which is not necessary for performing the first film-forming process, in order to perform the second film-forming process. On the other hand, according to the present aspect, the oxidizing agent is not used in both the first and second film-forming processes. Therefore, since it is not necessary to provide the oxidizing agent supplier, the manufacturing cost of the film forming apparatus can be reduced.

In addition, when the oxidation film is formed by the second film-forming process, it may be necessary to make the temperature condition in the second film-forming process different from the temperature condition in the first film-forming process. In this case, a long waiting time for temperature adjustment between the first film-forming process and the second film-forming process is required, which may cause an increase in downtime of the film forming apparatus. In addition, due to the temperature change in the process container, there is a concern that the film adhering to the inside of the process container is cracked by thermal stress, leading to generation of particles. On the other hand, according to the present aspect, since the nitridation film is formed by the second film-forming process, it is not necessary to make the temperature condition in the second film-forming process different from the temperature condition in the first film-forming process, and occurrence of such a problem can be avoided.

In addition, when an oxidation film is formed by the second film-forming process, an oxidizing agent and components thereof may remain in the processing container. In this case, in the first film-forming process to be performed thereafter, there is a concern that the oxidizing agent and components thereof desorbed from the inner wall of the process container and the like are mixed into the film formed on the wafer 200 and the film quality thereof is degraded. On the other hand, according to the present aspect, since the oxidizing agent is not used in the second film-forming process and the oxidizing agent and the components thereof cannot remain in the processing container, it is possible to avoid the occurrence of such a problem.

In addition, when an oxidation film is formed by the second film-forming process and a nitridation film having a tensile stress and an oxidation film having a compressive stress are alternately laminated in the processing container, film peeling may occur at the interface between the oxidation film and the nitridation film due to a difference in coefficient of thermal expansion between these films, leading to generation of particles. On the other hand, according to the present aspect, it is possible to reduce the difference in coefficient of thermal expansion between the films by using the nitridation films as the films alternately stacked in the process container, and it is possible to avoid the occurrence of such a problem.

In addition, when an oxidation film is formed by the second film-forming process, the outermost surface of the inner wall surface of the process container becomes an oxidation film in the initial stage of the first film-forming process to be performed thereafter. Since the formation rate of the nitridation film to be formed on the wafer 200 temporarily decreases, a phenomenon (film thickness drop phenomenon) in which the film thickness of the nitridation film to be formed on the wafer 200 temporarily drops may occur. On the other hand, according to the present aspect, since the nitridation film is formed by the second film-forming process, the outermost surface of the inner wall surface of the process container can be maintained as the nitridation film. Therefore, the occurrence of the film thickness drop phenomenon can be suppressed.

(b) When the first nitridation film having a tensile stress is formed by the first film-forming process, the second nitridation film having a compressive stress can be efficiently formed at a low temperature by supplying a raw material, a nitriding agent, and an inert gas excited into a plasma state as the second film-forming agent in the second film-forming process.

(c) In the second film-forming process, by depositing the second nitridation film on the surface of the first nitridation film, the stress of the film adhering to the inside of the process container can be reduced with good controllability regardless of the thickness of the film adhering to the inside of the process container.

(d) In the first film-forming process, by supplying a raw material and a nitriding agent as the first film-forming agent, the first nitridation film having a tensile stress can be efficiently formed.

(e) In the first film-forming process and the second film-forming process, the nitriding agent is excited into a plasma state and supplied, so that each of the first nitridation film and the second nitridation film can be efficiently formed at a low temperature.

(f) When the second film-forming process is performed every time the first film-forming process is performed once, it is possible to effectively reduce the stress of the film adhering to the inside of the process container.

(g) When the second film-forming process is performed every time the first film-forming process is performed a plural number of times, the frequency of performing the second film-forming process can be reduced. Therefore, the amount of the second film-forming agent used can be reduced.

(h) By performing the second film-forming process without the wafer 200 being housed in the process container, it is possible to reduce the stress of the film attached to the process container without adversely affecting the first nitridation film formed on the wafer 200.

(i) The first film-forming process is performed in a state in which the wafer 200 is supported by the boat 217 in the process container, and the second film-forming process is performed in a state in which the empty boat 217 that does not support the wafer 200 is housed in the process container. Therefore, the stress of the film adhering to the boat 217 can be reduced.

(j) In the second film-forming process, by using at least one of the $N_2$ gas and the rare gas as an inert gas to be excited into the plasma state, the second nitridation film having a compressive stress can be efficiently formed.

(k) In the first film-forming process and the second film-forming process, each of the first nitridation film and the second nitridation film can be efficiently formed by using the N and H-containing gas as a nitriding agent.

(l) The above-described various effects can be obtained in the case of using any of the above-described various source gases, in the case of using any of the above-described various nitriding agents, and in the case of using any of the above-described various inert gases.

(4) Modified Examples

The process sequence according to the present aspect can be modified as in the following modified examples. These modified examples can be arbitrarily combined. Unless otherwise specifically described, processing procedures and processing conditions in each step of each of the modified examples can be made similar to the processing procedures and processing conditions in each step of the process sequence described above.

Modified Example 1

When the first nitridation film having a tensile stress is formed by the first film-forming process, a raw material and an inert gas excited into a plasma state may be supplied as a second film-forming agent in the second film-forming process to form a second nitridation film having a compressive stress on the surface of the first nitridation film.

Figure 7:
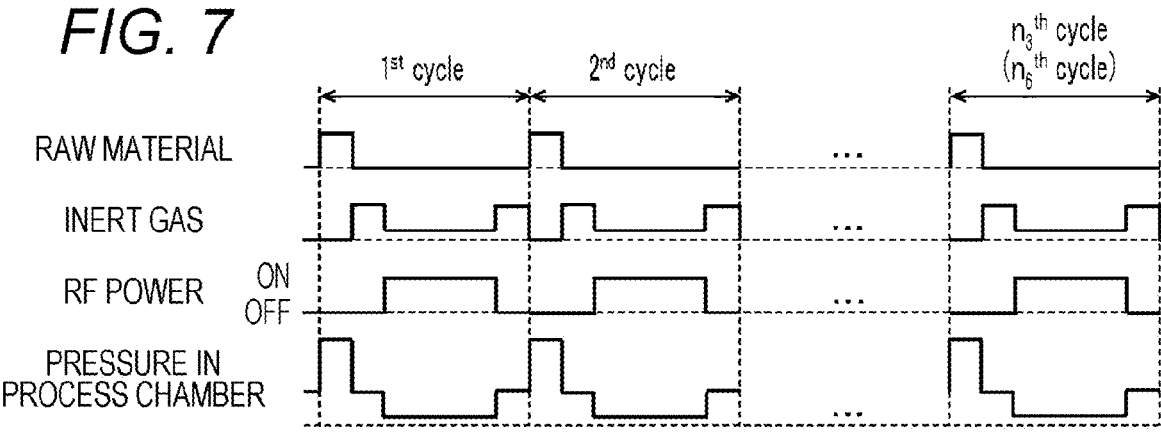
FIG. 7 is a diagram illustrating another example of the process sequence in one aspect of the present disclosure.

Specifically, as illustrated in FIG. 7 and the following process sequence, in the second film-forming process of the present modified example, a cycle in which a step C1 of supplying a raw material to the first nitridation film adhering to the inside of the process container and a step C2 of supplying an inert gas excited into a plasma state to the first nitridation film adhering to the inside of the process container are executed non-simultaneously may be performed a predetermined number of times ($n_3$ times, $n_3$ is an integer of 1 or more) to form a second nitridation film having a compressive stress on the surface of the first nitridation film.

Second film-forming process: (raw material-
→plasma-excited inert gas)×$n_3$

In step C1, a raw material is supplied to the first nitridation film adhering to the inside of the process container under the same processing procedures and processing conditions as in the raw material supply in the above step A1 (raw material supply). As the raw material, a raw material having an Si—N bond can be used. For example, a silylamine gas such as a monosilylamine (($SiH_3$) $NH_2$, abbreviated as MSA) gas, a disilylamine (($SiH_3$)$_2$NH, abbreviated as DSA) gas, or a trisilylamine (($SiH_3$)$_3$N, abbreviated as TSA) gas can be used. One or more of these can be used as a raw material. Among these, it is preferable to use a TSA gas having three Si—N bonds as a raw material. These raw materials can be supplied to the wafer 200 from the above-described raw material supplier. By performing this step, an SiN layer containing Si—N bonds is formed on the surface of the first nitridation film adhering to the inside of the process container.

In step C2, an inert gas is plasma-excited and supplied to the SiN layer formed on the surface of the first nitridation film adhering to the inside of the process container under the same processing procedure and processing conditions as in the supply of the plasma-excited inert gas in step B3 described above (supply of plasma-excited inert gas). As the inert gas, similarly to the inert gas in step B3, an $N_2$ gas, or a rare gas such as an Ar gas, a He gas, a Ne gas, or a Xe gas can be used. One or more of these gases can be used as the inert gas. In the present modified example, as the inert gas, it is preferable to use an $N_2$ gas among these. These inert gases can be supplied to the wafer 200 from the inert gas supplier described above.

Also in the second film-forming process of the present modified example, the second nitridation film having a compressive stress can be deposited on the surface of the first nitridation film having a tensile stress, and the same effect as the above-described aspect can be obtained. In addition, according to the present modified example, in the second film-forming process, the supply of the nitriding agent can be omitted to shorten the processing time. As a result, a throughput, that is, productivity can be improved.

Modified Example 2

When the first nitridation film having a tensile stress is formed by the first film-forming process, a step D in which an inert gas excited into a plasma state is supplied as a second film-forming agent may be performed in the second film-forming process to form a second nitridation film having a compressive stress on the surface of the first nitridation film.

In step D, an inert gas is plasma-excited and supplied to the first nitridation film adhering to the inside of the process container under the same processing procedures and processing conditions as in the supply of the plasma-excited inert gas in step B3 described above (supply of plasma-excited inert gas). As the inert gas, similarly to the inert gas in step B3, an $N_2$ gas, or a rare gas such as an Ar gas, a He gas, a Ne gas, or a Xe gas can be used. One or more of these gases can be used as the inert gas. In the present modified example, as the inert gas, it is preferable to use an $N_2$ gas among these. These inert gases can be supplied to the wafer 200 from the inert gas supplier described above.

In the second film-forming process in the present modified example, the surface of the first nitridation film having a tensile stress can be modified to change the surface to the second nitridation film having a compressive stress. That is, in the second film-forming process in the present modified example, a part of the first nitridation film having a tensile stress on its surface side can be modified to change the part on the surface side to the second nitridation film having a compressive stress. As a result, a laminated film obtained by laminating the first nitridation film having a tensile stress and the second nitridation film having a compressive stress is formed in the process container, and the same effects as those of the above-described aspect can be obtained. In addition, according to the present modified example, since the surface of the first nitridation film is modified and changed to the second nitridation film without depositing the second nitridation film on the surface of the first nitridation film, it is possible to reduce the stress of the film adhering to the inside of the process container with good controllability without increasing the thickness (accumulated film thickness) of the film adhering to the inside of the process container. In addition, according to the present modified example, the supply of the raw material and the nitriding agent can be omitted to shorten the processing time. As a result, a throughput, that is, productivity can be improved.

Second Aspect of Present Disclosure

In a film-forming sequence according to the present aspect, a process of forming a first nitridation film on the wafer 200 by supplying a first film-forming agent to the wafer 200 housed in the process container (first film-forming process) and a process of forming a second nitridation film on the surface of the first nitridation film attached to the process container by supplying a second film-forming agent to the first nitridation film attached to the process container in the first film-forming process (second film-forming process) are performed, so that when the first nitridation film having a compressive stress is formed by the first film-forming process, the second nitridation film having a tensile stress is formed in the second film-forming process.

In the present aspect, in the first film-forming process, for example, a raw material, a nitriding agent, and an inert gas excited into a plasma state can be supplied as a first film-forming agent to form a first nitridation film having a compressive stress on the wafer 200. In this case, in the second film-forming process, for example, a raw material and a nitriding agent can be supplied as a second film-forming agent to form a second nitridation film having a tensile stress on the surface of the first nitridation film adhering to the inside of the process container.

Also in the present aspect, the nitriding agent can be excited into a plasma state and supplied in each of the first film-forming process and the second film-forming process.

In the first film-forming process according to the present aspect, as illustrated in FIG. 6 and the following process sequence, a cycle in which a step E1 of supplying a raw material to the wafer 200 in the process container, a step E2 of supplying a nitriding agent excited into a plasma state to the wafer 200 in the process container, and a step E3 of supplying the inert gas excited into a plasma state to the wafer 200 in the process container are executed non-simultaneously is performed a predetermined number of times ($n_4$ times, $n_4$ is an integer of 1 or more) to form a first nitridation film having a compressive stress on the wafer 200.

In addition, in the second film-forming process according to the present aspect, as illustrated in FIG. 5 and the following process sequence, a cycle in which a step F1 of supplying a raw material to the first nitridation film adhering to the inside of the process container and a step $F_2$ of supplying a nitriding agent excited into a plasma state to the first nitridation film adhering to the inside of the process container are executed non-simultaneously is performed a predetermined number of times ($n_5$ times, $n_5$ is an integer of 1 or more) to form a second nitridation film having a tensile stress on the surface of the first nitridation film adhering to the inside of the process container.

First film-forming process: (raw material→plasma-
excited nitriding agent-plasma-excited inert
gas)×$n_4$ Second film-forming process: (raw material-
→plasma-excited nitriding agent)×$n_5$ The processing procedures and the processing conditions in steps E1 and F1 can be similar to the processing procedures and the processing conditions in step A1 described above. The processing procedures and the processing conditions in steps E2 and $F_2$ can be similar to the processing procedures and the processing conditions in step A2 described above. The processing procedures and the processing conditions in step E3 can be similar to the processing procedures and the processing conditions in step B3 described above. The other points can be similar to those of the first aspect described above.

As in the present aspect, when the first nitridation film having a compressive stress is formed by the first film-forming process, the second nitridation film having a tensile stress is formed by the second film-forming process, so that the same effects as those of the above-described aspect can be obtained. That is, by depositing the second nitridation film having a tensile stress on the surface of the first nitridation film having a compressive stress, the stress of the film adhering to the inside of the process container can be reduced, and the cumulative film thickness at which film peeling occurs can be increased. Therefore, it is possible to extend the cleaning cycle and shorten the downtime of the film forming apparatus, and as a result, it is possible to improve the productivity of the film-forming process. In addition, since the generation of microparticles can be suppressed, it is possible to improve the quality of the film formed on the wafer 200 and accordingly improve the yield rate greatly.

In addition, as in the present aspect, in the first film-forming process, by supplying a raw material, a nitriding agent, and an inert gas excited into a plasma state as a first film-forming agent, the first nitridation film having a compressive stress can be efficiently formed at a low temperature.

Third Aspect of Present Disclosure

In a film-forming sequence according to the present aspect, as in the second aspect, when a first nitridation film having a compressive stress is formed by the first film-forming process, a second nitridation film having a tensile stress is formed by the second film-forming process.

In the present aspect, in the first film-forming process, for example, a raw material and an inert gas excited into a plasma state can be supplied as a first film-forming agent to form a first nitridation film having a compressive stress on the wafer 200. In this case, in the second film-forming process, for example, a raw material and a nitriding agent can be supplied as a second film-forming agent to form a second nitridation film having a tensile stress on the surface of the first nitridation film adhering to the inside of the process container.

Also in the present aspect, the nitriding agent can be excited into a plasma state and supplied in the second film-forming process.

In the first film-forming process according to the present aspect, as illustrated in FIG. 7 and the following process sequence, a cycle in which a step G1 of supplying a raw material to the wafer 200 in the process container and a step G2 of supplying the inert gas excited into a plasma state to the wafer 200 in the process container are executed non-simultaneously is performed a predetermined number of times (no times, no is an integer of 1 or more) to form a first nitridation film having a compressive stress on the wafer 200.

In addition, in the second film-forming process according to the present aspect, as illustrated in FIG. 5 and the following process sequence, a cycle in which a step H1 of supplying a raw material to the first nitridation film adhering to the inside of the process container and a step $H_2$ of supplying a nitriding agent excited into a plasma state to the first nitridation film adhering to the inside of the process container are executed non-simultaneously is performed a predetermined number of times ($n_7$ times, $n_7$ is an integer of 1 or more) to form a second nitridation film having a tensile stress on the surface of the first nitridation film adhering to the inside of the process container.

First film-forming process: (raw material→plasma-excited inert gas)×$n_6$

Second film-forming process: (raw material-→plasma-excited nitriding agent)×$n_7$ The processing procedures and the processing conditions in steps G1 and H1 can be similar to the processing procedures and the processing conditions in step A1 described above. In step G1, as a raw material, a raw material having the Si—N bond exemplified in step C1 described above can be used. In step H1, as a raw material, the raw material exemplified in step A1 described above can be used. The processing procedures and the processing conditions in step G2 can be similar to the processing procedures and the processing conditions in step B3 described above. The processing procedures and the processing conditions in step H2 can be similar to the processing procedures and the processing conditions in step A2 described above. The other points can be similar to those of the first aspect described above.

As in the present aspect, when the first nitridation film having a compressive stress is formed by the first film-forming process, the second nitridation film having a tensile stress is formed by the second film-forming process, so that the same effects as those of the above-described aspect can be obtained. That is, by depositing the second nitridation film having a tensile stress on the surface of the first nitridation film having a compressive stress, the stress of the film adhering to the inside of the process container can be reduced, and the cumulative film thickness at which film peeling occurs can be increased. Therefore, it is possible to extend the cleaning cycle and shorten the downtime of the film forming apparatus, and as a result, it is possible to improve the productivity of the film-forming process. In addition, since the generation of microparticles can be suppressed, it is possible to improve the quality of the film formed on the wafer 200 and accordingly improve the yield rate greatly.

In addition, as in the present aspect, in the first film-forming process, by supplying a raw material and an inert gas excited into a plasma state as a first film-forming agent, the first nitridation film having a compressive stress can be efficiently formed at a low temperature.

In addition, according to the present aspect, in the first film-forming process, the supply of the nitriding agent can be omitted to shorten the processing time. As a result, a throughput, that is, productivity can be improved.

Other Aspects of Present Disclosure

The aspects of the present disclosure have been specifically described above. However, the present disclosure is not limited to the above aspects, and various modifications can be made without departing from the gist thereof.

For example, both the first film-forming process for forming the first nitridation film having a tensile stress and the first film-forming process for forming the first nitridation film having a compressive stress may be performed in the same process container. In this case, in the same process container, both the second film-forming process for forming the second nitridation film having a compressive stress and the second film-forming process for forming the second nitridation film having a tensile stress are performed at predetermined timings. That is, when the first nitridation film having a tensile stress is formed on the wafer 200 by the first film-forming process in the process container, the second nitridation film having a compressive stress is formed on the surface of the first nitridation film having a tensile stress attached to the process container in the second film-forming process. That is, when the first nitridation film having a compressive stress is formed on the wafer 200 by the first film-forming process in the process container, the second nitridation film having a tensile stress is formed on the surface of the first nitridation film having a compressive stress attached to the process container in the second film-forming process. Even in the case, effects similar to those in the various aspects described above can be obtained.

In addition, for example, in the first film-forming process, a process of forming a first nitridation film having a tensile stress and a process of forming a first nitridation film having a compressive stress may be alternately and continuously repeated to form a film (first laminated nitridation film) in which these films are alternately laminated. For example, when the first laminated nitridation film having a total tensile stress is formed on the wafer 200 by the first film-forming process, the second nitridation film having a compressive stress is formed on the surface of the first laminated nitridation film having a total tensile stress adhering to the inside of the process container by the second film-forming process. In addition, for example, when the first laminated nitridation film having a total compressive stress is formed on the wafer 200 by the first film-forming process, the second nitridation film having a tensile stress is formed on the surface of the first laminated nitridation film having a total compressive stress adhering to the inside of the process container by the second film-forming process. Even in the case, effects similar to those in the various aspects described above can be obtained.

In addition, for example, in the second film-forming process, a process of forming a second nitridation film having a tensile stress and a process of forming a second nitridation film having a compressive stress may be alternately and continuously repeated to form a film (second laminated nitridation film) in which these films are alternately laminated. For example, when a first nitridation film having a tensile stress is formed on the wafer 200 by the first film-forming process, a second laminated nitridation film having a total compressive stress is formed on the surface of the first nitridation film having a tensile stress attached to the process container by the second film-forming process. In addition, when a first nitridation film having a compressive stress is formed on the wafer 200 by the first film-forming process, a second laminated nitridation film having a total tensile stress is formed on the surface of the first nitridation film having a compressive stress attached to the process container by the second film-forming process. Even in the case, effects similar to those in the various aspects described above can be obtained.

In addition, the laminated nitridation film can be formed, for example, by the following process sequence (x, y, and z are each an integer of 1 or more). In this case, the total stress of the laminated nitridation film can be freely controlled, for example, by changing the ratio (x/y) of x to y in the following process sequence, that is, by adjusting the ratio ($T_x/T_y$) of the film thickness $T_x$ of the nitridation film having a tensile stress to the film thickness $T_y$ of the nitridation film having a compressive stress. For example, by satisfying x/y>1 (x>y), that is, by satisfying $T_x/T_y>1$ ($T_x>T_y$), it is easy to set the total stress of the laminated nitridation film as the tensile stress. In addition, for example, by satisfying x/y<1 (x<y), that is, by satisfying $T_x/T_y<1$ ($T_x<T_y$), it is easy to set the total stress of the laminated nitridation film as the compressive stress.

$$[(Raw\ material \rightarrow plasma\text{-}excited\ nitriding\ agent) \times x \rightarrow$$
$$(raw\ material \rightarrow plasma\text{-}excited\ nitriding\ agent\text{-}$$
$$\rightarrow plasma\text{-}excited\ inert\ gas) \times y] \times z$$

In addition, for example, in the above-described aspect, an example in which a plurality of kinds of film-forming agents are supplied non-simultaneously has been described, but various film-forming agents may be supplied simultaneously. For example, in the first aspect described above, at least parts of the execution periods of steps A1 and A2 may be made to overlap each other to set a period in which steps A1 and A2 are simultaneously performed. In addition, for example, at least parts of the execution periods of steps B1, B2, and B3 may be made to overlap each other to set a period in which steps B1, B2, and B3 are simultaneously performed. The same applies to the modified examples and other aspects. Even in the case, effects similar to those in the aspect described above can be obtained.

In addition, for example, in the above-described aspect, an example in which the second film-forming process is performed in a state in which the empty boat 217 is housed in the process container has been described, but the second film-forming process may be performed in a state in which dummy wafers are loaded in the boat 217. When the first film-forming process is performed in a state in which dummy wafers are loaded in the boat 217, the first nitridation film also adheres to the surfaces of the dummy wafers. Therefore, by performing the second film-forming process in a state in which the dummy wafers are loaded in the boat 217, the stress of the film adhering to the surfaces of the dummy wafers can also be reduced. Even in this case, effects similar to those in the above-described aspect can be obtained.

In addition, for example, in the above-described aspect, an example in which the second film-forming process is performed in a state in which the boat 217 is housed in the process container has been described, but the second film-forming process may be performed in a state in which the lower end opening of the manifold 209 is closed by the shutter 219s without the boat 217 being housed in the process container. Even in this case, effects similar to those in the above-described aspect can be obtained.

In addition, for example, in the above-described aspect, an example in which a silicon-based nitridation film is formed as the first nitridation film and the second nitridation film has been described, but a metal-based nitridation film may be formed. That is, the present disclosure can also be applied to a case in which a source gas containing a metal element, such as aluminum (Al), titanium (Ti), hafnium (Hf), zirconium (Zr), tantalum (Ta), molybdenum (Mo), and tungsten (W), is used as a raw material and nitridation films containing a metal, such as an aluminum nitridation film (AlN film), a titanium nitridation film (TiN film), a hafnium nitridation film (HfN film), a zirconium nitridation film (ZrN film), a tantalum nitridation film (TaN film), a molybdenum nitridation film (MON), a tungsten nitridation film (WN), an aluminum carbonitridation film (AlCN film), a titanium carbonitridation film (TiCN film), hafnium carbonitridation film (HfCN film), zirconium carbonitridation film (ZrCN film), tantalum carbonitridation film (TaCN film), molybdenum carbonitridation film (MoCN film), tungsten carbonitridation film (WCN film), titanium aluminum nitridation film (TiAlN film), and titanium aluminum carbonitridation film (TiAlCN film), are formed as the first and second nitridation films by the process sequences described above. The processing procedures and processing conditions when supplying the film-forming agent can be similar to those in each step in the above aspects. Even in the case, effects similar to those in the aspect described above can be obtained.

In addition, for example, as a plasma generation method, inductively coupled plasma (abbreviated as ICP) may be used in addition to capacitively coupled plasma (abbreviated as CCP). Even in this case, effects similar to those in the above-described aspect can be obtained.

Preferably, the recipe used in each processing is individually prepared according to processing contents and stored in the memory 121c through an electric communication line or the external memory 123. Then, when each processing is started, it is preferable that the CPU 121a appropriately selects an appropriate recipe among the plurality of recipes stored in the memory 121c according to processing contents. In this manner, it is possible to form films with various film types, composition ratios, film qualities, and thicknesses with excellent reproducibility by using one film forming apparatus. In addition, since a burden on the operator can be reduced, it is possible to quickly start each processing while avoiding operational errors.

The above-described recipe is not limited to being newly created, and may be prepared, for example, by changing the existing recipe already installed in the film forming apparatus. When the recipe is changed, the changed recipe may be installed in the film forming apparatus through an electric communication line or a recording medium in which the recipe is recorded. In addition, the existing recipe already installed in the film forming apparatus may be directly changed by operating the inputter/outputter 122 included in the existing film forming apparatus.

In the above-described various aspects and various modified examples, an example of forming a film using a batch type film forming apparatus that processes a plurality of substrates at a time has been described. The present disclosure is not limited to the above-described various aspects and various modified examples, and can be appropriately applied to, for example, a case of forming a film using a single wafer type film forming apparatus that processes one or more substrates at a time. In addition, in the above-described various aspects and various modified examples, an example of forming a film using a film forming apparatus having a hot wall type process furnace has been described. The present disclosure is not limited to the above-described various aspects and various modified examples, and can also be appropriately applied to a case of forming a film using a film forming apparatus having a cold wall type process furnace.

Even when these film forming apparatuses are used, it is possible to perform each processing under the same processing procedure and processing conditions as the processing procedure and processing conditions in the above-described various aspects and various modified examples. Therefore, it is possible to obtain the same effects as in the above-described various aspects and various modified examples.

The above-described various aspects and various modified examples can be appropriately combined and used. For example, the processing procedures and processing conditions at that time can be made similar to the processing procedures and processing conditions in the above-described various aspects and various modified examples.

Examples

As Example 1, an SiN film was formed on a plurality of wafers using the film forming apparatus according to the above-described aspect based on FIG. 5 and the process sequence illustrated below. DCS gas was used as a raw material, NH₃ gas was used as a nitriding agent, and N₂ gas was used as an inert gas. The other processing conditions were common conditions within the processing condition range in the above-described aspect.

As Example 2, an SiN film was formed on a plurality of wafers using the film forming apparatus according to the above-described aspect based on FIG. 6 and the process sequence illustrated below. DCS gas was used as a raw material, NH₃ gas was used as a nitriding agent, and N₂ gas was used as an inert gas. The other processing conditions were common conditions within the processing condition range in the above-described aspect.

Figure 10:
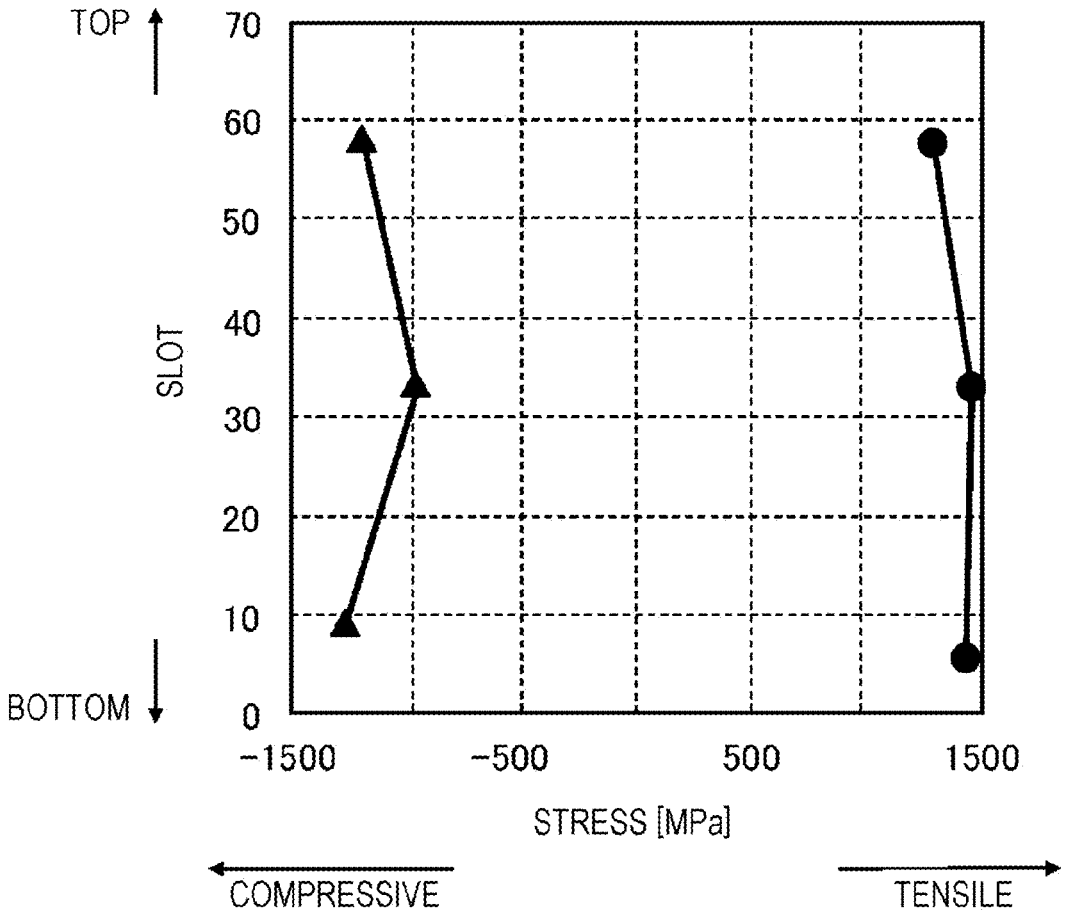
FIG. 10 is a diagram illustrating a measurement result of the stress of a nitridation film.

Then, the stress of the SiN film in each of Examples 1 and 2 was measured. The results are illustrated in FIG. 10. The horizontal axis in FIG. 10 indicates the stress [MPa] of the SiN film, and the positive stress means tensile stress and the negative stress means compressive stress. The vertical axis indicates the processing position of the wafer in the boat, and 0 means the Bottom side and 70 means the Top side. In the diagram, a mark • indicates Example 1, and a mark ▲ indicates Example 2.

As illustrated in FIG. 10, it was confirmed that the stress of the SiN film in Example 1 was a tensile stress of about 1200 to 1500 MPa. On the other hand, it was confirmed that the stress of the SiN film in Example 2 was a compressive stress of about 1000 to 1300 MPa. That is, it was confirmed that the stress of the SiN film could be freely controlled by appropriately selecting the process sequence illustrated in FIGS. 5 and 6.

According to the present disclosure, it is possible to suppress the occurrence of film peeling by reducing the stress of a film adhering to the inside of the process container.

The invention claimed is:

1. A film forming method, comprising:
(a) forming a first nitridation film on a substrate housed in a process container; and
(b) forming a second nitridation film on the surface of the first nitridation film adhering to the inside of the process container formed in (a),
wherein, when a cycle, in which
(i) supplying a raw material to the process container,
(ii) supplying a nitriding agent to the process container, and
(iii) supplying an inert gas excited into a plasma state to the process container,
are performed non-simultaneously, is executed to form the first nitridation film having a compressive stress in (a), a cycle, in which (i) and (ii) are performed non-simultaneously, is executed to form the second nitridation film having a tensile stress in (b); and
wherein, when a cycle, in which (i) and (ii) are performed non-simultaneously, is executed to form the first nitridation film having a tensile stress in (a), a cycle, in which (i), (ii) and (iii) are performed non-simultaneously, is executed to form the second nitridation film having a compressive stress in (b).

2. The film forming method according to claim 1, wherein, a cycle, in which (i) and (ii) are performed non-simultaneously, is executed to form the first nitridation film having a tensile stress in (a), a cycle, in which (i), (ii) and (iii) are performed non-simultaneously, is executed to form the second nitridation film having a compressive stress in (b).

3. The film forming method according to claim 1, wherein the second nitridation film is deposited on the surface of the first nitridation film in (b).

4. The film forming method according to claim 1, wherein, when a cycle, in which (i), (ii) and (iii) are performed non-simultaneously, is executed to form the first nitridation film having a compressive stress in (a), a cycle, in which (i) and (ii) are performed non-simultaneously, is executed to form the second nitridation film having a tensile stress in (b).

5. The film forming method according to claim 4, wherein the second nitridation film is deposited on the surface of the first nitridation film in (b).

6. The film forming method according to claim 1, wherein the nitriding agent is excited into a plasma state and supplied in (b).

7. The film forming method according to claim 6, wherein an inert gas acts as a purge gas.

8. The film forming method according to claim 6, wherein the inside of the process container is purged under a non-plasma atmosphere.

9. The film forming method according to claim 1, wherein (b) is performed every time (a) is performed once.

10. The film forming method according to claim 1, wherein (b) is performed every time (a) is performed a plural number of times.

11. The film forming method according to claim 1, wherein (b) is performed without the substrate being housed in the process container.

12. The film forming method according to claim 11, wherein
(a) is performed in a state in which the substrate is supported by a support in the process container, and
(b) is performed in a state in which the support that does not support the substrate is housed in the process container.

13. The film forming method according to claim 1, wherein the inert gas is at least one of an N2 gas and a rare gas.

14. A method of manufacturing a semiconductor device, comprising the method according to claim 1.

15. The film forming method according to claim 1, wherein the inside of the process container is purged during intervals (i), (ii), and (iii).

16. The film forming method according to claim 1, wherein the raw material in (i) used for forming the first nitridation film in (a) is the same as that used for forming the second nitridation film in (b).

17. The film forming method according to claim 1, wherein the nitriding agent in (ii) used for forming the first nitridation film in (a) is the same as that used for forming the second nitridation film in (b).

18. The film forming method according to claim 1, wherein the temperature condition for forming the second nitridation film in (b) is the same as the temperature condition for forming the first nitridation film in (a).

19. A film forming apparatus, comprising:
a process container in which a substrate is processed;
a film-forming agent supplier; and
a controller configured to be capable of controlling the film-forming agent supplier so that
(a) a process of forming a first nitridation film on the substrate housed in the process container, and (b) a process of forming a second nitridation film on a surface of the first nitridation film adhering to an inside of the process container formed in (a), are performed in the process container and so that when a cycle, in which (i) supplying a raw material to the process container, (ii) supplying a nitriding agent to the process container, and (iii) supplying an inert gas excited into a plasma state to the process container, are performed non-simultaneously, is executed to form the first nitridation film having a compressive stress in (a), a cycle, in which (i) and (ii) are performed non-simultaneously, is executed to form the second nitridation film having a tensile stress in (b); and when a cycle, in which (i) and (ii) are performed non-simultaneously, is executed to form the first nitridation film having a tensile stress in (a), a cycle, in which (i), (ii) and (iii) are performed non-simultaneously, is executed to form the second nitridation film having a compressive stress in (b).

20. A non-transitory computer-readable recording medium storing a program that causes, by a computer, a film forming apparatus to perform:

(a) forming a first nitridation film on a substrate housed in a process container; and (b) forming a second nitridation film on a surface of the first nitridation film adhering to an inside of the process container formed in (a), wherein, when a cycle, in which (i) supplying a raw material to the process container, (ii) supplying a nitriding agent to the process container, and (iii) supplying an inert gas excited into a plasma state to the process container, are performed non-simultaneously, is executed to form the first nitridation film having a compressive stress in (a), a cycle, in which (i) and (ii) are performed non-simultaneously, is executed to form the second nitridation film having a tensile stress in (b); and wherein, when a cycle, in which (i) and (ii) are performed non-simultaneously, is executed to form the first nitridation film having a tensile stress in (a), a cycle, in which (i), (ii) and (iii) are performed non-simultaneously, is executed to form the second nitridation film having a compressive stress in (b).

* * * * *